(12) United States Patent
Itoh et al.

(10) Patent No.: US 9,312,454 B2
(45) Date of Patent: Apr. 12, 2016

(54) SULFUR-CONTAINING PHOSPHOR COATED WITH ZNO COMPOUND

(75) Inventors: Jun-ichi Itoh, Ageo (JP); Asuka Sasakura, Ageo (JP); Masaaki Inamura, Ageo (JP); Riichi Ogawara, Ageo (JP); Akinori Kumagai, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 13/991,521

(22) PCT Filed: Dec. 6, 2011

(86) PCT No.: PCT/JP2011/078127
§ 371 (c)(1),
(2), (4) Date: Jun. 4, 2013

(87) PCT Pub. No.: WO2012/077656
PCT Pub. Date: Jun. 14, 2012

(65) Prior Publication Data
US 2013/0256715 A1 Oct. 3, 2013

(30) Foreign Application Priority Data
Dec. 9, 2010 (JP) ................................. 2010-274532

(51) Int. Cl.
| | |
|---|---|
| H01L 29/18 | (2006.01) |
| H01L 33/00 | (2010.01) |
| B32B 5/16 | (2006.01) |
| B32B 15/00 | (2006.01) |
| H01L 33/50 | (2010.01) |
| H01L 33/52 | (2010.01) |

(Continued)

(52) U.S. Cl.
CPC ............ *H01L 33/504* (2013.01); *C09K 11/025* (2013.01); *C09K 11/7731* (2013.01); *H01L 33/50* (2013.01); *H01L 33/52* (2013.01); *Y10T 428/256* (2015.01)
USPC ................ 257/88; 257/98; 428/328; 428/432

(58) Field of Classification Search
CPC ....... H01L 33/20; H01L 33/504; H01L 33/50; H01L 33/52; Y10T 428/296; C09K 11/025
USPC ............. 257/88, 98, 79, 40; 438/22; 428/328, 428/432
See application file for complete search history.

(56) References Cited

U.S. PATENT DOCUMENTS

| | | | |
|---|---|---|---|
| 5,126,204 A | 6/1992 | Tono et al. | |
| 5,132,044 A * | 7/1992 | Takahashi et al. | ...... 252/301.6 S |

(Continued)

FOREIGN PATENT DOCUMENTS

| | | |
|---|---|---|
| CN | 101336479 A | 12/2008 |
| CN | 101775278 A | 7/2010 |

(Continued)

*Primary Examiner* — Long K Tran
*Assistant Examiner* — Dzung Tran
(74) *Attorney, Agent, or Firm* — The Webb Law Firm

(57) ABSTRACT

Provided is a novel coated phosphor capable of effectively suppressing the adverse effects of hydrogen sulfide gas generated by the reaction between a sulfur-containing phosphor and moisture in the air. Provided is a sulfur-containing phosphor having a configuration in which ZnO compound containing Zn and O is present on the surface of a sulfur-containing phosphor having a host material which includes sulfur.

20 Claims, 13 Drawing Sheets

(51) Int. Cl.
 *C09K 11/02* (2006.01)
 *C09K 11/77* (2006.01)

(56) References Cited

U.S. PATENT DOCUMENTS

| | | | |
|---|---|---|---|
| 5,985,173 A | 11/1999 | Gray et al. | |
| 6,069,439 A * | 5/2000 | Matsuda et al. | 313/461 |
| 6,686,691 B1 | 2/2004 | Mueller et al. | |
| 8,012,792 B2 | 9/2011 | Yoon et al. | |
| 8,262,936 B2 | 9/2012 | Kim et al. | |
| 2002/0063301 A1* | 5/2002 | Hanamoto et al. | 257/432 |
| 2004/0166320 A1 | 8/2004 | Kobusch | |
| 2006/0237690 A1 | 10/2006 | Tsuji et al. | |
| 2007/0125984 A1 | 6/2007 | Tian et al. | |
| 2007/0138438 A1* | 6/2007 | Hampden-Smith et al. | 252/301.36 |
| 2008/0023712 A1* | 1/2008 | Mueller et al. | 257/98 |
| 2008/0032415 A1* | 2/2008 | Nishigaki et al. | 436/172 |
| 2008/0128679 A1* | 6/2008 | Tian et al. | 257/14 |
| 2008/0185600 A1 | 8/2008 | Thomas | |
| 2009/0009079 A1* | 1/2009 | Kim et al. | 313/582 |
| 2010/0006775 A1 | 1/2010 | Gibson | |

FOREIGN PATENT DOCUMENTS

| | | |
|---|---|---|
| DE | 2747509 A1 | 4/1979 |
| EP | 0372560 B1 | 3/1995 |
| JP | 59105074 A | 6/1984 |
| JP | 2155983 A | 6/1990 |
| JP | 02308892 A | 12/1990 |
| JP | 06293938 A | 10/1994 |
| JP | 2002060747 A | 2/2002 |
| JP | 2002080845 A | 3/2002 |
| JP | 2002173675 A | 6/2002 |
| JP | 2002223008 A | 8/2002 |
| JP | 2003041250 A | 2/2003 |
| JP | 2003268368 A | 9/2003 |
| JP | 2004250705 A | 9/2004 |
| JP | 2005082788 A | 3/2005 |
| JP | 2006028458 A | 2/2006 |
| JP | 2007056267 A | 3/2007 |
| JP | 2007146008 A | 6/2007 |
| JP | 2007197612 A | 8/2007 |
| JP | 2007214579 A | 8/2007 |
| JP | 2008007779 A | 1/2008 |
| JP | 2009013186 A | 1/2009 |
| JP | 2009526089 A | 7/2009 |
| WO | 2007064416 A1 | 6/2007 |
| WO | 2007080555 A1 | 7/2007 |

* cited by examiner

SULFUR-CONTAINING PHOSPHOR COATED WITH ZNO COMPOUND

TECHNICAL FIELD

The present invention relates to a sulfur-containing phosphor having a host material which includes sulfur.

BACKGROUND ART

As a representative example of a red phosphor, not only a sulfur-containing phosphor having a host material which includes sulfur such as (Ca, Sr)S:Eu, (Zn, Cd)(S, Se):Ag, and $Ba_2ZnS_3$:Mn is known but also a red phosphor consisting of calcium sulfide (CaS) as a host material, Eu as a luminescent center (that is, activator), and Mn, Li, Cl, Ce, Gd, or the like as a sensitizing agent (co-activator) is disclosed in Patent Document 1 or 2.

Further, as a green phosphor, a sulfur-based thiogallate phosphor expressed as (Ca, Sr, Ba)(Al, Ga, In)$_2$S$_4$:Eu is known (Patent Documents 3, 4, and 5). Further, as a blue phosphor, a sulfur-containing phosphor such as SrS:Ce, (Sr, Ca)Ga$_2$S$_4$:Ce, BaAl$_2$S$_4$:Eu, and Ba$_2$SiS$_4$:Ce is known.

As described above, a sulfur-containing phosphor having a host material which includes sulfur is excited by an LED or the like and can emit various colors depending on composition, and therefore it is being developed as various phosphors.

Meanwhile, the sulfur-containing phosphor of various kinds described above can easily react with water. As such, when stored or used in an atmospheric condition, a problem arises in that it reacts with moisture or the like in the air, and as a result of hydrolysis, the phosphor is deteriorated to yield weak light emission.

Yet another problem has been noticed that the sulfur in a sulfur-containing phosphor reacts with water to generate hydrogen sulfide gas, and the resulting hydrogen sulfide gas inhibits, when used for a white LED in particular, curing of a silicone resin to be admixed with the phosphor or oxidizes a metal member present inside the device such as Ag coating film that is coated for increasing reflection ratio of a lead frame (hereinafter, referred to as an "Ag reflection film"), yielding lowered reflection performance or providing cause for electrical defects such as disconnection.

In this connection, for purpose of improving moisture resistance or the like, a method of coating the aforementioned kinds of phosphor with a glass material or the like (Patent Documents 6, 7, 8, 9, and 10), a method of coating the surface of phosphor particles by chemical vapor phase reaction method (Patent Document 11), and a method of attaching particles of a metal compound (Patent Document 12) or the like are conventionally suggested.

CITATION LIST

Patent Document

Patent Document 1: JP 2002-80845 A
Patent Document 2: JP 2003-41250 A
Patent Document 3: JP 2002-060747 A
Patent Document 4: JP 2007-056267 A
Patent Document 5: JP 2007-214579 A
Patent Document 6: JP 2002-223008 A
Patent Document 7: JP 2004-250705 A
Patent Document 8: JP 2002-173675 A
Patent Document 9: JP 2008-7779 A
Patent Document 10: JP 2009-13186 A
Patent Document 11: JP 2005-82788 A
Patent Document 12: JP 2006-28458 A When a phosphor is coated with glass, water resistance is increased, and thus a problem of weak light emission caused by deterioration of the phosphor by moisture present in the air is solved. However, it is difficult to suppress the adverse effect caused by hydrogen sulfide gas, and an effect of preventing corrosion of an Ag reflection film is not obtained, for example.

SUMMARY OF THE INVENTION

Under the circumstances, the present invention is to provide a novel coated phosphor which is capable of effectively suppressing the adverse effect of hydrogen sulfide gas.

The invention provides a sulfur-containing phosphor coated with a ZnO compound having a configuration in which the ZnO compound containing Zn and O is present on the surface of a sulfur-containing phosphor having a host material which includes sulfur.

The ZnO compound has a property of chemically adsorbing sulfur, and thus when the ZnO compound is present on the surface of a sulfur-containing phosphor, the ZnO compound can absorb hydrogen sulfide gas even if it is generated. Thus, the adverse effect of hydrogen sulfide gas can be effectively suppressed. Further, as the ZnO compound does not absorb light such as an LED and thus has no effect on color, it is also excellent in that the luminescence properties of a phosphor itself are not lowered.

BEST MODE(S) FOR CARRYING OUT THE INVENTION

Figure 1:
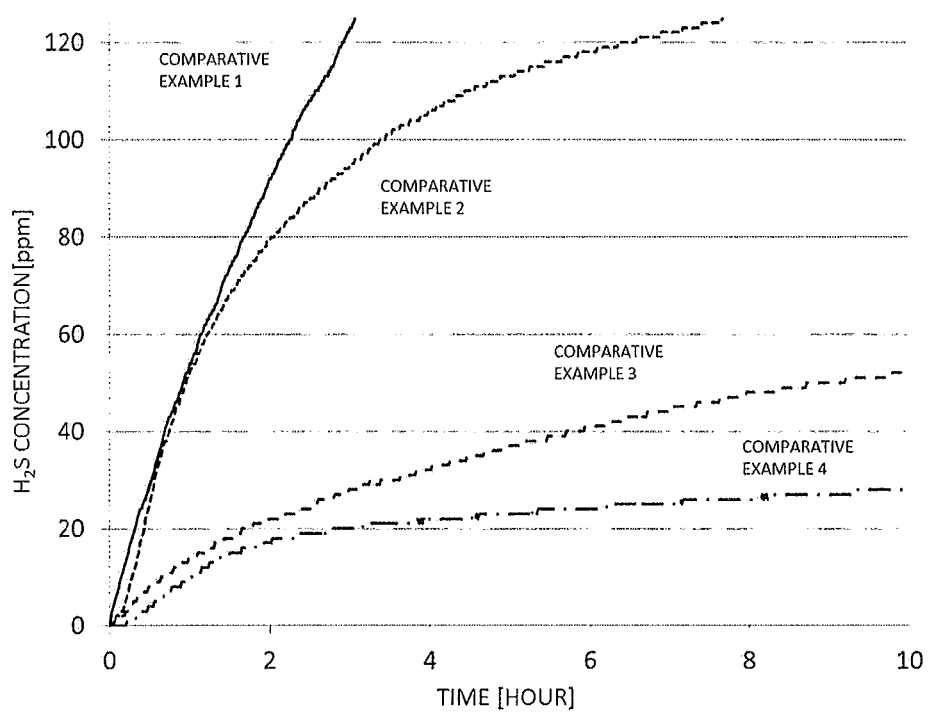
FIG. 1 is a graph for illustrating the test result of evaluating hydrogen sulfide gas generation amount in Comparative Examples 1 to 5, in which the horizontal axis represents the elapsed time (hour) for storage in an incubator and the vertical axis represents the concentration of hydrogen sulfide (ppm)
Figure 2:
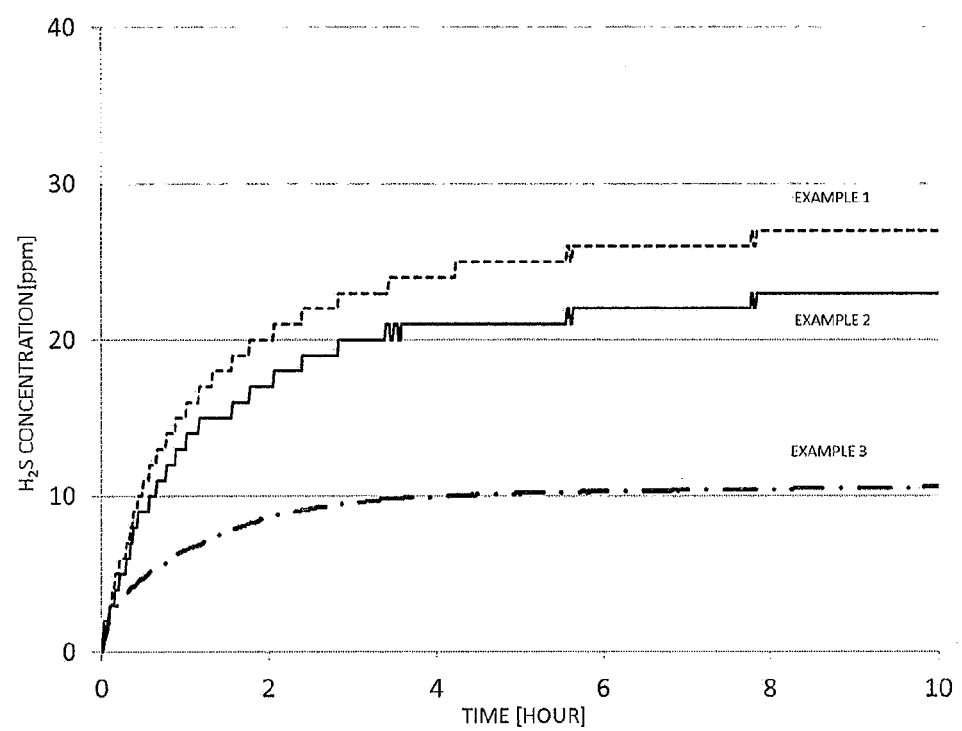
FIG. 2 is a graph for illustrating the test result of evaluating hydrogen sulfide gas generation amount in Examples 1 to 3, in which the horizontal axis represents the elapsed time (hour) for storage in an incubator and the vertical axis represents the concentration of hydrogen sulfide (ppm)
Figure 3:
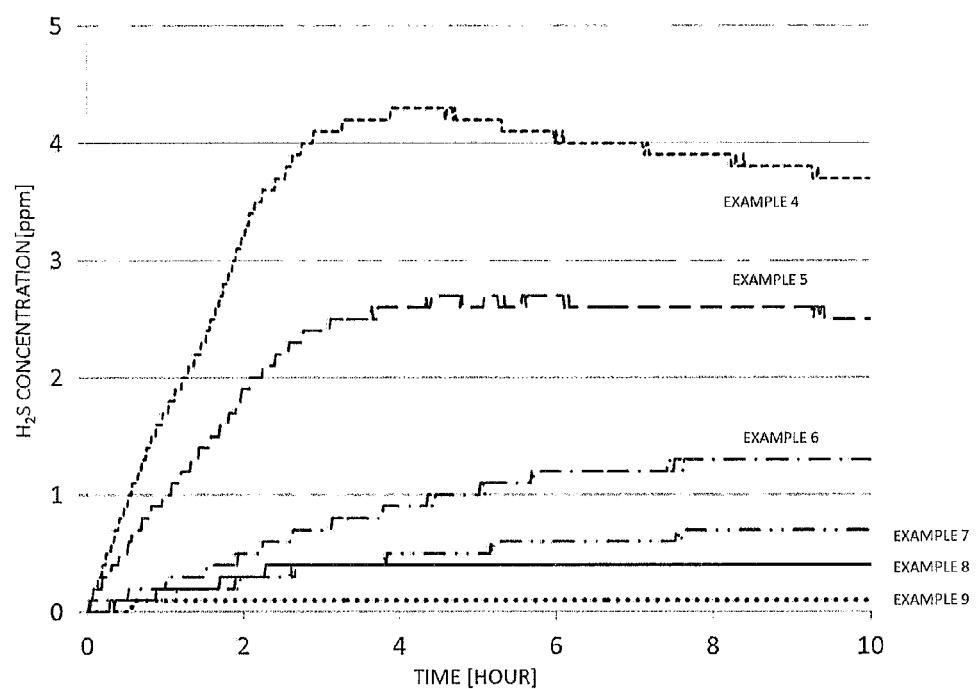
FIG. 3 is a graph for illustrating the test result of evaluating hydrogen sulfide gas generation amount in Examples 4 to 9, in which the horizontal axis represents the elapsed time (hour) for storage in an incubator and the vertical axis represents the concentration of hydrogen sulfide (ppm)
Figure 4:
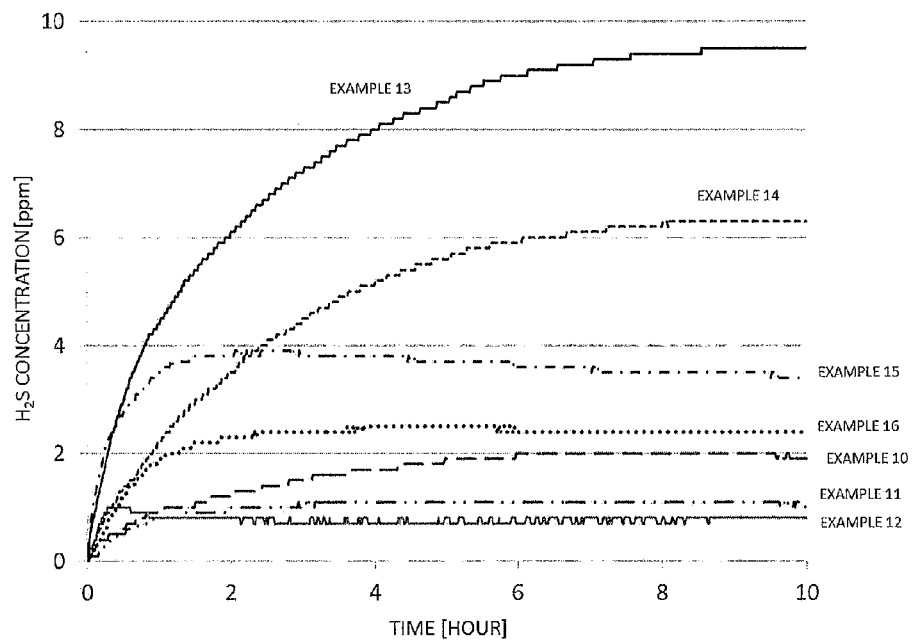
FIG. 4 is a graph for illustrating the test result of evaluating hydrogen sulfide gas generation amount in Examples 10 to 16, in which the horizontal axis represents the elapsed time (hour) for storage in an incubator and the vertical axis represents the concentration of hydrogen sulfide (ppm)
Figure 5:
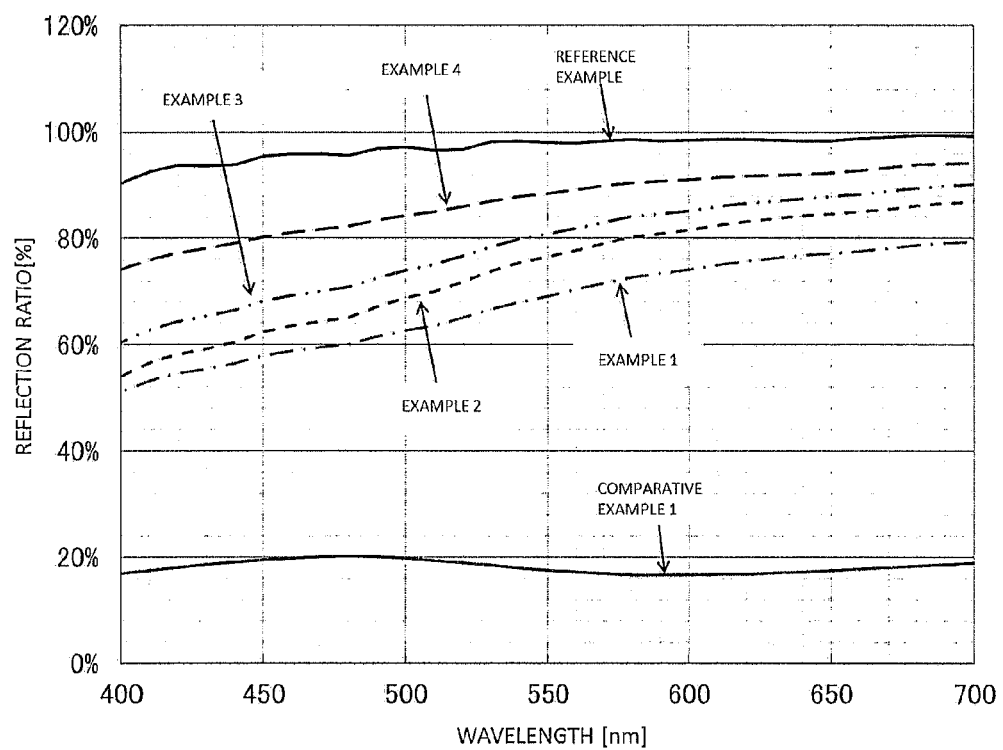
FIG. 5 is a graph for illustrating the test result of evaluating Ag corrosion in Reference Example, Examples 1 to 4, and Comparative Example 1 in which the horizontal axis represents the wavelength (nm) and the vertical axis represents the reflection ratio (%) of the Ag film.
Figure 6:
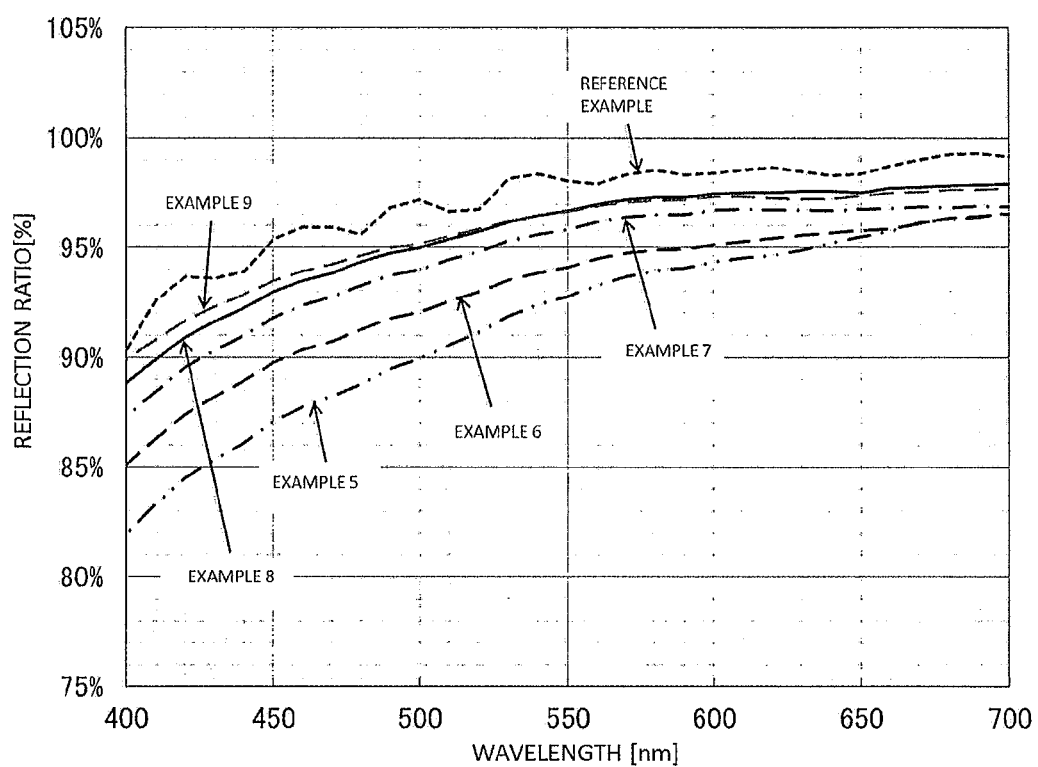
FIG. 6 is a graph for illustrating the test result of evaluating Ag corrosion in Reference Example and Examples 5 to 9, in which the horizontal axis represents the wavelength (nm) and the vertical axis represents the reflection ratio (%) of the Ag film.
Figure 7:
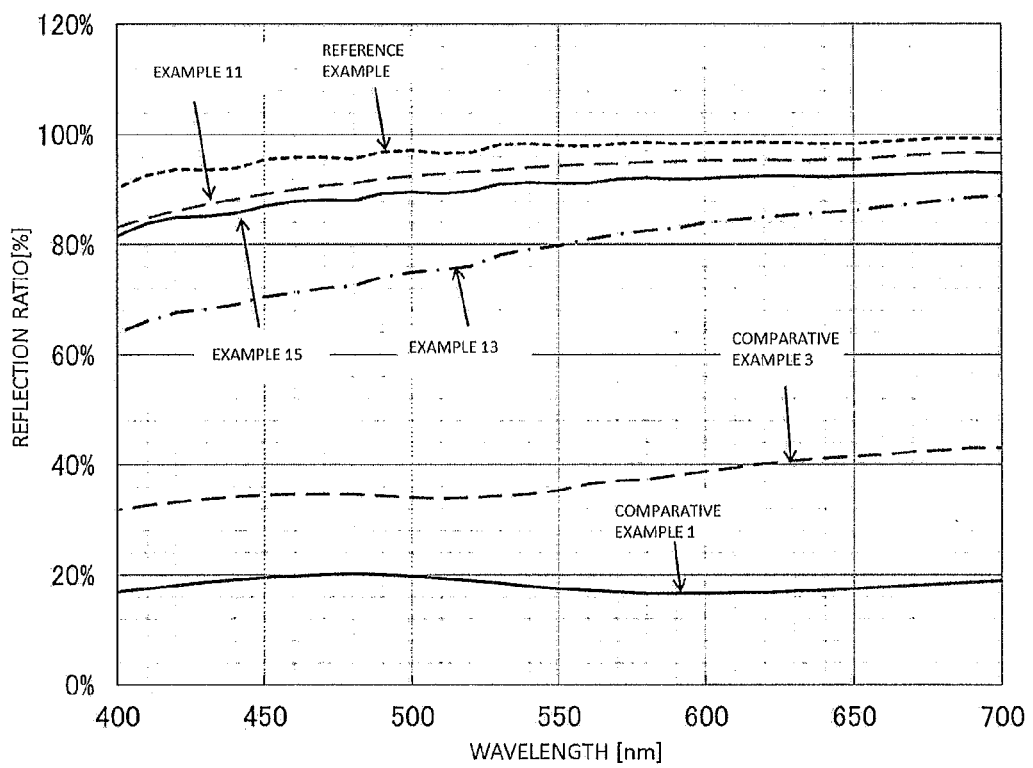
FIG. 7 is a graph for illustrating the test result of evaluating Ag corrosion in Reference Example, Examples 11, 13, and 15, and Comparative Examples 1 and 3, in which the horizontal axis represents the wavelength (nm) and the vertical axis represents the reflection ratio (%) of the Ag film.
Figure 8:
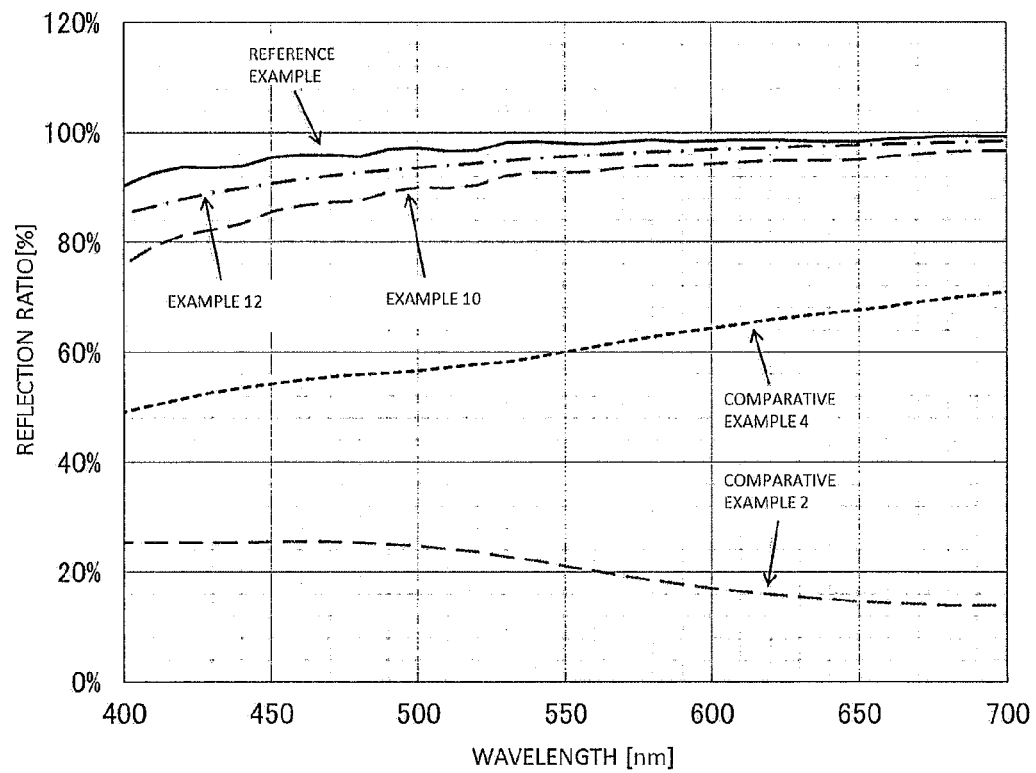
FIG. 8 is a graph for illustrating the test result of evaluating Ag corrosion in Reference Example, Examples 10 and 12, and Comparative Examples 2 and 4, in which the horizontal axis represents the wavelength (nm) and the vertical axis represents the reflection ratio (%) of the Ag film.
Figure 9:
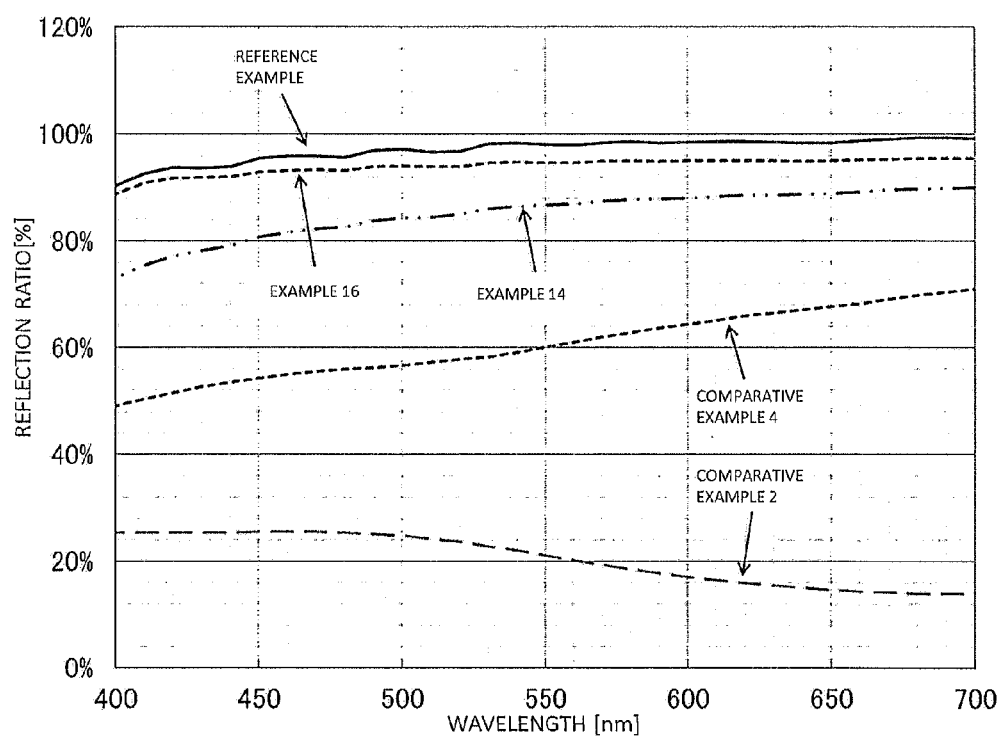
FIG. 9 is a graph for illustrating the test result of evaluating Ag corrosion in Reference Example, Examples 14 and 16, and Comparative Examples 2 and 4, in which the horizontal axis represents the wavelength (nm) and the vertical axis represents the reflection ratio (%) of the Ag film.

Hereinafter, embodiments for carrying out the invention are explained in greater detail; however the scope of the invention is not limited to the embodiments given below.

(Phosphor of the Invention)

Phosphor according to the present embodiment (hereinafter, referred to as a "phosphor of the invention") is powder (hereinafter, referred to as "phosphor powder of the invention") consisting of sulfur-containing phosphor particles (hereinafter, referred to as a "phosphor particles of the invention") that are coated with a ZnO compound having a configuration in which the ZnO compound containing Zn and O is present on the surface of a sulfur-containing phosphor having a host material which includes sulfur.

The expression that "ZnO compound is present on the surface of a sulfur-containing phosphor" includes a case in which an any material or layer is interposed between the surface of a sulfur-containing phosphor and a ZnO compound as well as a case in which the ZnO compound is present on the surface of a sulfur-containing phosphor while being in contact with the surface.

(Sulfur-Containing Phosphor)

As long as sulfur is included, host material of the phosphor of the invention has no particularly limited configuration, because it is believed that, as long as sulfur (S) is included in a host material, hydrogen sulfide gas may be generated in accordance with reaction with moisture in the air regardless of the configuration, and also as long as a ZnO compound is present on the surface of the phosphor, the generated hydrogen sulfide gas may be absorbed regardless of the configuration of phosphor.

Specific examples of the host material of the phosphor of the invention include (Ca, Sr, Ba)S, (Zn, Cd)(S, Se), $Ba_2ZnS_3$, (Ca, Sr, Ba)(Al, Ga, In)$_2S_4$:Eu, (Ca, Sr, Ba)Ga$_2S_4$, and $BaAl_2S_4$, and $Ba_2SiS_4$, but not limited thereto.

Meanwhile, examples of the luminescent center (i.e., luminescent ion) of an activating element or a co-activating element used in combination with the host material include ions of a rare earth metal such as Sc, Ce, Pr, Nd, Pm, Sm, Eu, Tb, Dy, Ho, Er, Tm, and Yb and ions or transition metal such as Cr, Ti, Ag, Cu, Au, Al, Mn, and Sb, but not limited thereto.

Specific examples of the phosphor of the invention include, $Ba_2(Si_{1-x}Al_x)S_4$:Ce (with the proviso that, x in the formula is as follows: $0<x<1$) and SrS:Ce as a blue phosphor, $SrGa_2S_4$: Eu, SrS:Tb, and CaS:Ce as a green phosphor, $CaGa_2S_4$:Eu, $Sr_2SiS_4$:Eu, CaS:Ce, and Eu, as a yellow phosphor, $(Ca_{1-x}Sr_x)$S:Eu, In (with the proviso that, x in the formula is between 0 and 1) as a red phosphor, and $La_2O_2S$:Eu, $Y_2O_2S$:Eu, but not limited thereto.

Further, of those described above, the phosphor may be used either singly or in combination of two or more phosphors.

The phosphor of the invention may appropriately contain, if necessary, various additives such as a plasticizer, a pigment, an anti-oxidant, a heat stabilizer, a UV absorbing agent, a light stabilizer, a flame retardant, a lubricating agent, a foaming agent, a filler, an anti-static agent, and a reinforcement material such as fiber.

Particle shape of the phosphor particles of the invention is not particularly limited.

With regard to particle size of the phosphor powder of the invention, although not particularly limited, D50 based on volume-based particle size distribution that is obtained by laser diffraction scattering type particle size distribution measurement is preferably between 0.1 μm and 50 μm, more preferably between 1 μm and 30 μm, and particularly preferably between 2 μm and 20 μm, from the view point of dispersion property.

When D50 is greater than 0.1 μm, the light emission efficiency tends not to decrease, and also no aggregation occurs among phosphor particles. In addition, when it is smaller than 50 μm, the dispersion property is maintained and therefore uneven coating or clogging of a dispenser or the like can be prevented.

(ZnO Compound)

The ZnO compound containing Zn and O is characterized in that it can react with hydrogen sulfide gas and does not affect the color by not absorbing light such as an LED; it is white and transparent in other words. Thus, the specific configuration of the ZnO compound is not limited. Examples of the ZnO compound containing Zn and O include one or more types of crystalline microparticles that are selected from ZnO, $Zn(OH)_2$, $ZnSO_4 \cdot nH_2O$ ($0 \le n \le 7$), $ZnTi_2O_4$, $Zn_2Ti_3O_8$, $Zn_2TiO_4ZnTiO_3$, $ZnBaO_2$, $ZnBa_2O_3$, $ZnGa_2O_4$, $Zn_{1.23}Ga_{0.28}O_2$, $Zn_3GaO_4$, $Zn_6Ga_2O_9$, $Zn_{0.125-0.95}Mg_{0.05-0.9}O$, $Zn_{0.1-0.75}Ca_{0.25-0.9}O$, $ZnSrO_2$, $Zn_{0.3}Al_{2.4}O_4$, $ZnAl_2O_4$, $Zn_{3-7}In_2O_{6-10}$, $ZnSnO_3$, and $Zn_2SnO_4$, and it may also have other configuration.

Further, it may be zinc salts of an organic acid such as zinc stearate.

From the Examples given below and results of various tests which have been carried out until now, it is confirmed that, when the ZnO compound is present as microparticles on the surface of a sulfur-containing phosphor, the influence of hydrogen sulfide gas can be reduced so that it is unnecessary to coat the surface of a sulfur-containing phosphor with a ZnO compound layer in which microparticles of the ZnO compound are continuously connected to each other. Further, when the ZnO compound is present as particles, compared to a case in which the film is formed with the ZnO compound, surface area for adsorbing hydrogen sulfide is increased, and therefore excellent adsorption performance of hydrogen sulfide can be obtained. Accordingly, while the phosphor of the invention includes a case in which the ZnO compound is not attached to part of the surface of the sulfur-containing phosphor, the phosphor of the invention does not include a case in which a film consisting of the ZnO compound is applied on the surface of the sulfur-containing phosphor.

It is also acceptable that, as the ZnO compound layer in which particles of the ZnO compound are continuously connected to each other, particles of the ZnO compound are present on the surface of the sulfur-containing phosphor, and it corresponds to a preferred embodiment of the invention.

It is also preferable that the ZnO compound and sulfur of the phosphor are not chemically bonded to each other. When S of the phosphor and Zn of the ZnO compound react with each other to generate ZnS due to chemical bonding, not only the reaction with hydrogen sulfide gas is suppressed but also it may serve as a cause for corrosion of new Ag reflection film. As such, the ZnO compound is required to be physically attached onto surface of the sulfur-containing phosphor.

In this regard, when Example 4 (without a glass base) that is described below is compared to Example 11 (with $B_2O_3$—$SiO_2$ glass base), Example 11 exhibited less hydrogen sulfide generation than Example 4 (Ag reflection ratio may be highly maintained) in spite that content of zinc ($N_{Zn}/N_S$) is higher in Example 4, and therefore it was confirmed that no direct reaction between ZnO and S of the phosphor can give better reactivity with hydrogen sulfide gas.

The ZnO compound is preferably microparticles having an average particle diameter of 0.3 μm or less as observed by SEM or TEM. In particular, the average particle diameter is more preferably between 1 nm and 100 nm. When the average particle diameter is 0.3 μm or less, light emitted from the LED is not scattered by the particles of the ZnO compound and absorption of light emitted from the LED by the phosphor is not inhibited, and therefore desirable. Further, since the purpose of applying the ZnO compound is to adsorb hydrogen sulfide gas, and from this point of view, it is also preferable that the ZnO compound has a large specific surface area. It can be said that average particle diameter is more preferably 100 nm or less.

Further, the average particle diameter observed by SEM or TEM indicates average particle diameter of any one hundred particles that are observed under any ten sections for observation. When the particle has an aspect ratio, the average value of the long diameter and short diameter is taken as particle diameter of the particle.

The mass ratio between the phosphor and the ZnO compound is preferably as follows; sulfur-containing phosphor: ZnO compound=1:0.005 to 1:1. When the ratio of the ZnO compound is within the range, not only the hydrogen sulfide gas adsorption effect can be obtained but also the light emission efficiency of the phosphor can be maintained without interfering light emission by phosphor after it absorbs light emitted from the LED. From this point of view, it is preferable that sulfur-containing phosphor:ZnO compound=1:0.01 to 1:0.5. More preferably, it is 1:0.02 to 1:0.3.

With regard to the presence ratio of the ZnO compound (in particular, Zn), from the view point of suppressing adverse effects of hydrogen sulfide gas, ratio of $N_{Zn}$, which is the number of Zn atoms in the ZnO compound, to $N_S$, which is the number of S atoms in the sulfur-containing phosphor, that is, $N_{Zn}/N_S$, is preferably 0.0050 or more. More preferably, it is 0.0100 or more. Still more preferably, it is 0.0200 or more. Meanwhile, from the view point of not interfering light emission by phosphor after it absorbs light emitted from the LED, ratio of $N_{Zn}$, which is the number of Zn atoms in the ZnO compound, to $N_S$, which is the number of S atoms in the sulfur-containing phosphor, that is, $N_{Zn}/N_S$, is preferably 1.0000 or less. More preferably, it is 0.5000 or less. Still more preferably, it is 0.3000 or less.

With regard to a method of placing the ZnO compound on the surface of the sulfur-containing phosphor, it is possible that powder of ZnO compound is added and dispersed by ultrasonication in a solvent (for example, ethanol), powder of the sulfur-containing phosphor is added thereto and stirred, and the solvent is evaporated to attach the ZnO compound on the surface of the sulfur-containing phosphor particles.

Further, it is also possible that powder of the sulfur-containing phosphor and powder of ZnO compound are dry-blended together by using a blender or the like for attaching the ZnO compound on the surface of the sulfur-containing phosphor particles.

Additional method for forming a ZnO compound layer on the surface of the sulfur-containing phosphor includes a chemical vapor phase reaction method or the like.

(Glass Layer)

When the phosphor particles of the invention additionally have a glass layer containing a glass composition, water resistance can be enhanced.

With regard to the form of having a glass layer in the phosphor particles of the invention, it is possible that a ZnO compound is present on the surface of the sulfur-containing phosphor and a glass layer is provided for coating it or a glass layer is formed on the surface of the sulfur-containing phosphor and then a ZnO compound layer is formed on the surface of the glass layer. In addition, it is also possible to provide at least three coating layers including the sulfur-containing phosphor, in which any one layer is a glass layer and any other layer is a ZnO compound layer.

The glass layer is just required to contain a glass composition. Examples of the glass composition include glass having composition such as $SiO_2$, $B_2O_3$—$SiO_2$, and $Ma_2O$—$MbO$—$B_2O_3$—$SiO_2$ (Ma represents an alkali metal and Mb represents an alkali earth metal or Zn), but not limited thereto.

With regard to a method of applying a glass layer, it is possible that a precursor mixture containing a precursor for glass layer, water, and a solvent is prepared, the precursor mixture is admixed with phosphor particles to induce a sol-gel reaction, surface of the phosphor particles is coated with glass, only the phosphor particles having a glass layer formed thereon are selectively obtained by filtering, and the obtained phosphor particles are dried and treated with heat.

Further, it is also possible that phosphor particles and powder of glass composition are admixed with each other and the mixture of the glass composition powder and phosphor particles is treated with heat so that the glass composition powder is melt and can cover the phosphor particles, followed by cooling the mixture.

Still further, a method of coating surface of phosphor particles based on a chemical vapor phase reaction method or a method of attaching particles of a metal compound can be also used.

From the view point of maintaining light emission from the phosphor, it is preferable that the glass layer has a dense and continuous structure. When it has a dense and continuous structure, it is possible that part of the phosphor surface is exposed as it is not adhered with a glass layer.

Further, although a glass composition containing Zn is exemplified as a glass composition, as the glass layer preferably has a dense and continuous structure, the glass layer has a small surface area, and thus the hydrogen sulfide gas adsorption capacity of the glass layer will be insufficient for preventing corrosion of an Ag reflection film.

(Spinel Microparticles)

It is also possible that microparticles having a spinel type crystal structure and a particle diameter of less than 0.1 μm (hereinafter, referred to as "spinel microparticles") are present near the ZnO compound or the ZnO compound layer, preferably in contact with the ZnO compound or the ZnO compound layer.

Many of the chemical compounds with a spinel type structure have high chemical stability, and thus are mostly stable at higher temperature or water, and depending on composition, they are colorless and transparent. Further, when the particle diameter is less than 0.1 μm, absorption of light with certain wavelength and emission of light with other wavelength by a phosphor are not interfered even when they are present near the phosphor. Thus, by having the spinel microparticles near the ZnO compound or the ZnO compound layer, whitening of ZnO compound by absorbing moisture can be further suppressed.

To have the spinel microparticles near the ZnO compound or the ZnO compound layer, a method of placing the ZnO compound as described above can be performed. Meanwhile, to have the spinel microparticles near the ZnO compound, it is possible that the ZnO compound and the spinel microparticles are mixed and adhered on the surface of the sulfur-containing phosphor or the ZnO compound is adhered on the surface of the sulfur-containing phosphor and the spinel microparticles are adhered on top of the ZnO compound. However, it is not limited to those methods.

For such cases, the amount of the spinel microparticles is not particularly limited. For example, it may be between 5 and 95% by mass, preferably between 10% by mass and 70% by mass, and more preferably between 25% by mass and 50% by mass of the ZnO compound.

Examples of the spinel microparticles include microparticles of a composite oxide having spinel type crystal structure such as $ZnAl_2O_4$, $ZnGa_2O_4$, and $Zn_2TiO_4$. The particle diameter of the spinel microparticles (that is, particle diameter observed by SEM or TEM) is preferably less than 0.1 μm, more preferably 0.07 μm or less, and particularly preferably 0.05 μm or less from the view point of ensuring transparency.

Further, when the layer containing the spinel microparticles is included such that it is in contact with the ZnO compound or ZnO compound layer, it may be considered that the same effect as the case in which the spinel microparticles are present near the ZnO compound or ZnO compound layer can be obtained.

(Additional Water Resistant Layer)

The phosphor particles of the invention may additionally have a water resistant layer which contains at least one hydroxide, oxide, or fluoride selected from a group consisting of Ti, Mg, Ca, Sr, Ba, Al, Ga, In, Sn, Zr, and Y, or a mixture of two or more of them (they are referred to as a "water resistant material").

Since a hydroxide, oxide, or fluoride selected from a group consisting of Ti, Mg, Ca, Sr, Ba, Al, Ga, In, Sn, Zr, and Y has particularly excellent water resistance, water resistance of the phosphor can be further increased by forming a layer containing these. In particular, when it is included together with the aforementioned glass layer, the water resistance of the phosphor can be significantly increased.

The water resistant layer may be present on ZnO compound, or either inside or outside of the ZnO compound. Further, when it is co-present with a glass layer, it may be present either inside or outside of the glass layer.

Further, the aforementioned water resistant material may be included in the glass layer.

Amount of the water resistant material is, although not particularly limited, between 0.1 and 50% by mass, preferably between 1% by mass and 30% by mass, and more preferably between 3% by mass and 15% by mass per the sulfur-containing phosphor.

Method for forming the water resistant layer is not particularly limited, and it may be performed in the same manner as the method of having ZnO compound described above. However, as preferred examples of a method of forming a denser layer, a method such as chemical vapor phase reaction method can be exemplified.

Figure 13:
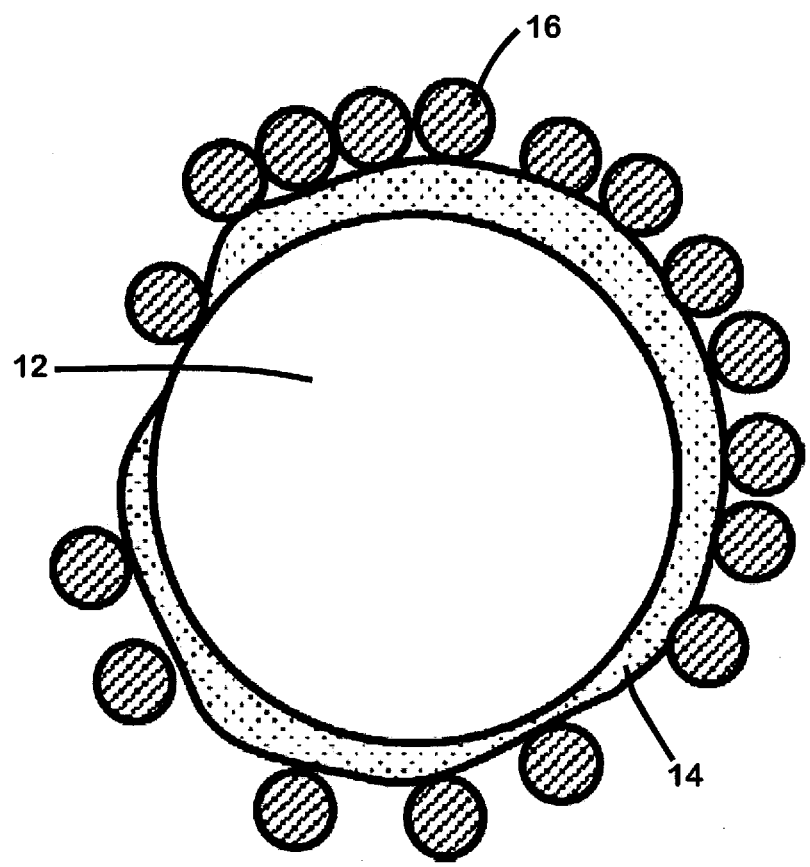
FIG. 13 is a schematic drawing of a ZnO compound coated sulfur-containing phosphor particle.

With reference to FIG. 13, a schematic drawing of a ZnO compound coated sulfur-containing phosphor particle 12 is illustrated. The particle 12 is coated with a glass layer 14. A ZnO compound layer, formed of ZnO compound particles 16, is formed on the surface of the glass layer 14.

(Use)

By placing the phosphor of the invention near light emission source such as an LED, a laser, or a diode, the phosphor of the invention can form a light emitting device or apparatus and thus can be used for various applications. For example, it may be directly placed on top of the LED or indirectly contacted with an aid of a tackiness agent or an adhesive.

By placing the phosphor of the invention near the LED, it may be used for a back light or the like of an image display apparatus such as liquid crystal display apparatus as well as a lighting device or a special light source.

Further, by having an electric field source or an electron source near the light emitting body and placing them near those described above, it may be used for a display device such as EL, FED, and CRT. As described herein, "near the light emitting body" means a position at which light emitted from the light emitting body can be received.

More specifically, it may be used for forming a wavelength conversion light emitting device having at least one LED chip and at least one phosphor in which part of the light emitted from the LED is absorbed by the phosphor to yield mixture light including light emitted from the LED and light emitted from the phosphor, and the device may be used as a light emitting device of a lighting apparatus or an image display apparatus.

Further, the light emitting device may be configured such that a solid light emitting device such as the LED is placed on top of a metal member as a reflection plate and a phosphor-containing layer consisting of the phosphor of the invention blended in a resin is formed.

For such case, part of the ZnO compound of the phosphor of the invention is released from the sulfur-containing phosphor and scattered in the resin. The released ZnO compound may be either evenly or unevenly scattered in the phosphor-containing layer, and it may be also scattered with concentration distribution in the direction of depth. Further, it may be scattered in layer form after sedimentation.

Examples of the metal member in the aforementioned light emitting device include a metal member which reacts with sulfur-based gas, for example, a metal or an alloy containing one or more metals of Group VIII metal or Group IB metal. Specific examples thereof include silver, silver-based alloy, copper, copper-based alloy, nickel, nickel-based alloy, iron, and iron-based alloy.

Further, with regard to the resin in the aforementioned light emitting device, any one of a transparent or white thermoplastic resin, a transparent or white thermosetting resin, and a transparent or white photo-curable resin may be used.

The aforementioned light emitting device can be preferably used for a light apparatus such as an LED light bulb apparatus and an LED lighting apparatus, a back light of a liquid crystal television, or a component of a visual device such as a signal and an indicator.

EXPLANATION OF TERMINOLOGY

In the specification, the expression "between X and Y" (X and Y are any numbers) includes, unless specifically described otherwise, meaning of "preferably greater than X"

and "preferably less than Y" as well as the meaning of "the same or greater than X but the same or less than Y."

Further, in the specification, the expression "X or more" (X is any number) includes, unless specifically described otherwise, meaning of "preferably greater than X" and the expression "Y or less" (Y is any number) includes, unless specifically described otherwise, meaning of "preferably less than Y".

EXAMPLES

Hereinafter, the invention is explained in view of the Examples and the Comparative Examples. However, the invention is not to be construed as being limited thereto.

Comparative Example 1

Synthesis of $SrGa_2S_4:Eu^{2+}(Sr_{0.97}Eu_{0.09}Ga_2S_4)$ Phosphor

SrS, $Ga_2S_3$, and EuS as a starting material were weighed and mixed to have desired composition, and then further mixed for 100 min by a paint shaker using zirconia ball with $\phi 3$ mm as a medium. The obtained mixture was calcined for 4 hours at 980° C. under atmosphere of hydrogen sulfide. Thereafter, the calcined product was ground for 1 min using an automatic grinding mixer (trade name: ALM-360T, manufactured by NITTO KAGAKU Co., Ltd.), and by using a sieve of 140 mesh and a sieve of 440 mesh, those under the sieve of 140 mesh but above the sieve of 440 mesh were collected to obtain the phosphor powder (sample) consisting of $SrGa_2S_4$:$Eu^{2+}$. The obtained phosphor was subjected to an ICP analysis by using SPS7800 manufactured by Seiko Instruments Inc., and as a result, Zn was not detected.

Comparative Example 2

Synthesis of $CaS:Eu^{2+}(Ca_{0.99}Eu_{0.01}S)$ Phosphor

CaS and EuS as a starting material were weighed and mixed to have desired composition, and then further mixed for 100 min by a paint shaker using zirconia ball with $\phi 3$ mm as a medium. The obtained mixture was calcined for 6 hours at 1100° C. under atmosphere of hydrogen sulfide. Thereafter, the calcined product was ground for 1 min using an automatic grinding mixer (trade name: ALM-360T, manufactured by NITTO KAGAKU Co., Ltd.), and by using a sieve of 140 mesh and a sieve of 440 mesh, those under the sieve of 140 mesh but above the sieve of 440 mesh were collected to obtain the phosphor powder (sample) consisting of CaS: $Eu^{2+}$. The obtained phosphor was subjected to an ICP analysis in the same manner as the Comparative Example 1, and as a result, Zn was not detected.

Comparative Example 3

Synthesis of $B_2O_3$—$SiO_2$ Glass Coated $SrGa_2S_4$:$Eu^{2+}$ Phosphor

To ethanol in which the $SrGa_2S_4:Eu^{2+}$ phosphor obtained from Comparative Example 1 was suspended, pure water, $Si(OEt)_4$, and $H_3BO_3$ were added and a small amount of ammonia water was further added as a catalyst for hydrolysis at 60° C. Accordingly, a glass precursor and phosphor composite in which surface of the phosphor is coated with the glass precursor gel was synthesized.

The resulting composite was heated for 30 min at 600° C. to obtain $B_2O_3$—$SiO_2$ glass coated $SrGa_2S_4:Eu^{2+}$ phosphor. The obtained phosphor was subjected to an ICP analysis in the same manner as Comparative Example 1, and as a result, Zn was not detected. Further, as a result of the ICP analysis, the mass ratio between the phosphor component and the glass component ($SiO_2$ and $B_2O_3$) was found to be 1:0.0383.

Comparative Example 4

Synthesis of $SiO_2$ Glass Coated $CaS:Eu^{2+}$ Phosphor

To ethanol in which the $CaS:Eu^{2+}$ phosphor obtained from Comparative Example 2 was suspended, pure water and $Si(OEt)_4$ were added and a small amount of ammonia water was further added as a catalyst for hydrolysis at 60° C. Accordingly, $SiO_2$ glass coated $CaS:Eu^{2+}$ phosphor which had been coated with $SiO_2$ glass was obtained. The obtained phosphor was subjected to an ICP analysis in the same manner as Comparative Example 1, and as a result, Zn was not detected. Further, as a result of the ICP analysis, the mass ratio between the phosphor component and the glass component ($SiO_2$) was found to be 1:0.0442.

Example 1

Synthesis of ZnO Compound Coated Sulfur-Containing Phosphor

To 100 parts by mass of the phosphor that is described below, 0.5 parts by mass of ZnO (average particle diameter of 30 nm) were added together with 50 mL of ethanol in a flask with side arm. By using an ultrasonicator, ZnO was dispersed in ethanol. To the mixture, 10 g of the $SrGa_2S_4:Eu^{2+}$ phosphor obtained from Comparative Example 1 were added and the ethanol was evaporated using an evaporator under stirring. As a result, ZnO adhered $SrGa_2S_4:Eu^{2+}$ phosphor was obtained. The obtained phosphor was subjected to an ICP analysis by using SPS7800 manufactured by Seiko Instruments Inc. As a result, $N_{Zn}/N_S$ was found to be 0.00506.

Further, when the obtained ZnO adhered $SrGa_2S_4:Eu^{2+}$ phosphor was observed under SEM (trade name: XL30-SFEG, manufactured by FEI), it was found that primary particles of ZnO are partially adhered in an aggregated state on the surface of the $SrGa_2S_4:Eu^{2+}$ phosphor particles, and the surface of the phosphor particles is partially exposed. The average particle diameter of the primary particles of ZnO was not different from the average particle diameter of the starting material.

In every example given below, the solvent (that is, ethanol or toluene) and the phosphor were added at the ratio of 50 mL and 10 g, respectively.

Further, the average particle diameter of ZnO observed by SEM (trade name: XL30-SFEG, manufactured by FEI, with magnification ratio of 200,000) indicates average particle diameter of any one hundred particles that are observed under any ten sections for observation. When the particle has an aspect ratio, the average value of the long diameter and short diameter is taken as particle diameter of the particle. The same applies to the average particle diameter described below.

Example 2-9

Synthesis of ZnO Compound Coated Sulfur-Containing Phosphor

To 100 parts by mass of the phosphor that is described below, ZnO (average particle diameter of 30 nm) in an amount of 1 part by mass (Example 2), 2 parts by mass (Example 3), 5 parts by mass (Example 4), 10 parts by mass (Example 5), 20 parts by mass (Example 6), 30 parts by mass (Example 7), 50 parts by mass (Example 8), or 100 parts by mass (Example 9) were added together with 50 mL of ethanol in a flask with side arm. By using an ultrasonicator, ZnO was dispersed in ethanol. To the mixture, 10 g of the $SrGa_2S_4:Eu^{2+}$ phosphor obtained from Comparative Example 1 were added and the ethanol was evaporated using an evaporator under stirring. As a result, ZnO adhered $SrGa_2S_4:Eu^{2+}$ phosphor was obtained. The obtained phosphor (Examples 2 to 9) was subjected to an ICP analysis by using SPS7800 manufactured by Seiko Instruments Inc. As a result, $N_{Zn}/N_S$ was found to be 0.01020, 0.02100, 0.05360, 0.10900, 0.21800, 0.32900, 0.55100, and 1.09000, respectively.

Further, when the obtained ZnO adhered $SrGa_2S_4:Eu^{2+}$ phosphor was observed under SEM (trade name: XL30-SFEG, manufactured by FEI), it was found that primary particles of ZnO are partially adhered in an aggregated state on the surface of the $SrGa_2S_4:Eu^{2+}$ phosphor particles of Examples 2 and 3, and the surface of the phosphor particles is partially exposed. However, from Examples 4 to 9, it was found that primary particles of ZnO are adhered in an aggregated state on entire surface of the $SrGa_2S_4:Eu^{2+}$ phosphor particles, and the surfaces of the phosphor particles are not exposed at all.

In any of Examples 2 to 9, the average particle diameter of the primary particles of ZnO was not different from the average particle diameter of the starting material.

Example 10

Synthesis of ZnO Compound Coated Sulfur-Containing Phosphor

To 100 parts by mass of the phosphor that is described below, 2 parts by mass of ZnO (average particle diameter of 30 nm) were added together with 50 mL of ethanol in a flask with side arm. By using an ultrasonicator, ZnO was dispersed in ethanol. To the mixture, 10 g of the $CaS:Eu^{2+}$ phosphor obtained from Comparative Example 2 were added and the ethanol was evaporated using an evaporator under stirring. As a result, ZnO adhered $CaS:Eu^{2+}$ phosphor was obtained.

The obtained phosphor was subjected to an ICP analysis by using SPS7800 manufactured by Seiko Instruments Inc. As a result, $N_{Zn}/N_S$ was found to be 0.0171.

Further, when the obtained ZnO adhered $CaS:Eu^{2+}$ phosphor was observed under SEM (trade name: XL30-SFEG, manufactured by FEI), it was found that primary particles of ZnO are partially adhered in an aggregated state on the surface of the $CaS:Eu^{2+}$ phosphor particles, and the surface of the phosphor particles is partially exposed. The average particle diameter of the primary particles of ZnO was not different from the average particle diameter of the starting material.

Example 10-2

Synthesis of ZnO Compound Coated Sulfur-Containing Phosphor

To ethanol in which the ZnO adhered $CaS:Eu^{2+}$ phosphor obtained from Comparative Example 10 is suspended, pure water and $Si(OEt)_4$ were added and a small amount of ammonia water was further added as a catalyst for hydrolysis at 60° C. Accordingly, ZnO adhered $SiO_2$ glass coated $CaS:Eu^{2+}$ phosphor which had been coated with $SiO_2$ glass was obtained. The resulting phosphor was subjected to an ICP analysis in the same manner as Comparative Example 1, and as a result, $N_{Zn}/N_S$ was found to be 0.0168. Further, as a result of the ICP analysis, the mass ratio between the phosphor component and the glass component ($SiO_2$) was found to be 1:0.0493. Further, it was found that primary particles of ZnO are partially adhered in an aggregated state on the surface of the $CaS:Eu^{2+}$ phosphor particles, and the surfaces of the phosphor particles are partially exposed. The average particle diameter of the primary particles of ZnO was not different from the average particle diameter of the starting material.

Example 11

Synthesis of ZnO Compound Coated Sulfur-Containing Phosphor

To 100 parts by mass of the phosphor that is described below, 2 parts by mass of ZnO (average particle diameter of 30 nm) were added together with 50 mL of ethanol in a flask with side arm. By using an ultrasonicator, ZnO was dispersed in ethanol. To the mixture, 10 g of the $B_2O_3$—$SiO_2$ glass coated $SrGa_2S_4:Eu^{2+}$ phosphor obtained from Comparative Example 3 were added and the ethanol was evaporated using an evaporator under stirring. As a result, ZnO adhered $B_2O_3$—$SiO_2$ glass coated $SrGa_2S_4:Eu^{2+}$ phosphor was obtained.

The obtained phosphor was subjected to an ICP analysis by using SPS7800 manufactured by Seiko Instruments Inc. As a result, $N_{Zn}/N_S$ was found to be 0.0225.

Further, when the obtained ZnO adhered $B_2O_3$—$SiO_2$ glass coated $SrGa_2S_4:Eu^{2+}$ phosphor was observed under SEM (trade name: XL30-SFEG, manufactured by FEI), it was found that primary particles of ZnO are partially adhered in an aggregated state on the surface of the $B_2O_3$—$SiO_2$ glass coated $SrGa_2S_4:Eu^{2+}$ phosphor particles, and the surface of the phosphor particles is partially exposed. The average particle diameter of the primary particles of ZnO was not different from the average particle diameter of the starting material.

Example 11-2

Synthesis of ZnO Compound Coated Sulfur-Containing Phosphor

To 100 parts by mass of the phosphor that is described below, 2 parts by mass of ZnO (average particle diameter of 30 nm) were added together with 50 mL of ethanol in a flask with side arm. By using an ultrasonicator, ZnO was dispersed in ethanol. To the mixture, 10 g of the glass precursor and phosphor composite before the heat treatment which had been obtained from Comparative Example 3 were added and the ethanol was evaporated using an evaporator under stirring. As a result, ZnO adhered glass precursor and $SrGa_2S_4:Eu^{2+}$ phosphor composite was obtained. The resulting composite was treated by heat for 30 min at 600° C. for glassification of a glass precursor. As a result, ZnO adhered $B_2O_3$—$SiO_2$ coated $SrGa_2S_4:Eu^{2+}$ phosphor was obtained.

The obtained phosphor was subjected to an ICP analysis by using SPS7800 manufactured by Seiko Instruments Inc. As a result, $N_{Zn}/N_S$ was found to be 0.0223. Further, as a result of the ICP analysis, the mass ratio between the phosphor component and the glass component ($SiO_2$ and $B_2O_3$) was found to be 1:0.0386.

Further, when the obtained ZnO adhered $B_2O_3$—$SiO_2$ glass coated $SrGa_2S_4:Eu^{2+}$ phosphor was observed under SEM (trade name: XL30-SFEG, manufactured by FEI), it was found that primary particles of ZnO are partially adhered in an aggregated state on the surface of the $B_2O_3$—$SiO_2$ glass coated $SrGa_2S_4$:$Eu^{2+}$ phosphor particles, and the surface of the phosphor particles is partially exposed. The average particle diameter of the primary particles of ZnO was not different from the average particle diameter of the starting material even when ZnO was treated with heat.

Example 12

Synthesis of ZnO Compound Coated Sulfur-Containing Phosphor

To 100 parts by mass of the phosphor that is described below, 2 parts by mass of ZnO (average particle diameter of 30 nm) were added together with 50 mL of ethanol in a flask with side arm. By using an ultrasonicator, ZnO was dispersed in ethanol. To the mixture, 10 g of the $SiO_2$ glass coated CaS:$Eu^{2+}$ phosphor which had been obtained from Comparative Example 4 was added and the ethanol was evaporated using an evaporator under stirring. As a result, ZnO adhered $SiO_2$ glass coated CaS:$Eu^{2+}$ phosphor was obtained.

The obtained phosphor was subjected to an ICP analysis by using SPS7800 manufactured by Seiko Instruments Inc. As a result, $N_{Zn}/N_S$ was found to be 0.0193.

Further, when the obtained ZnO adhered $SiO_2$ glass coated CaS:$Eu^{2+}$ phosphor was observed under SEM (trade name: XL30-SFEG, manufactured by FEI), it was found that primary particles of ZnO were partially adhered in an aggregated state on the surface of the $SiO_2$ glass coated CaS:$Eu^{2+}$ phosphor particles, and the surface of the $SiO_2$ glass coated CaS:$Eu^{2+}$ phosphor particles was partially exposed. The average particle diameter of the primary particles of ZnO was not different from the average particle diameter of the starting material.

Examples 13-16

Synthesis of Zinc Stearate Coated Sulfur-Containing Phosphor

To 100 parts by mass of the phosphor that is described below, 5 parts by mass of zinc stearate was added together with toluene and dissolved therein. To the resulting solution, the phosphor obtained from Comparative Example 1, 2, 3, or 4 was added and the toluene was evaporated using an evaporator under stirring. As a result, zinc stearate coated sulfur-containing phosphor was obtained.

Further, when a surface of each obtained zinc stearate coated sulfur-containing phosphor was observed under SEM (trade name: XL30-SFEG, manufactured by FEI), it was found that the zinc stearate was partially adhered in film state on the surface of the phosphor particles, and the surface of the phosphor particles was partially exposed.

Comparative Example 5

Synthesis of ZnO Compound Coated Sulfur-Containing Phosphor

To 100 parts by mass of the phosphor that is described below, 0.1 parts by mass of ZnO (average particle diameter of 30 nm) was added together with 50 mL of ethanol in a flask with side arm. By using an ultrasonicator, ZnO was dispersed in ethanol. To the mixture, 10 g of the $SrGa_2S_4$:$Eu^{2+}$ phosphor which had been obtained from Comparative Example 1 was added and the ethanol was evaporated using an evaporator under stirring. As a result, ZnO adhered $SrGa_2S_4$:$Eu^{2+}$ phosphor was obtained. The obtained phosphor (Comparative Example 5) was subjected to an ICP analysis by using SPS7800 manufactured by Seiko Instruments Inc. As a result, $N_{Zn}/N_S$ was found to be 0.00097.

Example 17

Synthesis of ZnO Compound Coated Sulfur-Containing Phosphor

ZnO (average particle diameter of 20 nm) and $Al_2O_3$ (average particle diameter of 20 nm) were admixed with each other at weight ratio of 1:1, and then calcined at 1200° C. for 30 min in the air to obtain $ZnAl_2O_4$ (average particle diameter of 100 nm). Next, the obtained powder was ground for 1 hour by using a beads mill (that is, paint shaker manufactured by ASADA IRON WORKS CO., LTD.) (zirconia beads 0.8 mm$\phi$, in ethanol). The average particle diameter of the obtained $ZnAl_2O_4$ was found to be 30 nm.

To 100 parts by mass of the phosphor that is described below, 4.1 parts by mass of ZnO (average particle diameter of 20 nm) and 2.5 parts by mass of $ZnAl_2O_4$ (average particle diameter of 30 nm) which had been prepared in the above were added together with 50 mL of ethanol in a flask with side arm. By using an ultrasonicator, ZnO and $ZnAl_2O_4$ particles were dispersed in ethanol. To the mixture, 10 g of the $B_2O_3$—$SiO_2$ glass coated $SrGa_2S_4$:Eu phosphor which had been obtained from Comparative Example 3 was added and the ethanol was evaporated using an evaporator under stirring. As a result, ZnO and $ZnAl_2O_4$ adhered $B_2O_3$—$SiO_2$ glass coated $SrGa_2S_4$:Eu phosphor was obtained. The obtained phosphor was subjected to an ICP analysis by using SPS7800 manufactured by Seiko Instruments Inc. As a result, $N_{Zn}/N_S$ was found to be 0.0551.

Further, when the obtained ZnO and $ZnAl_2O_4$ adhered $B_2O_3$—$SiO_2$ glass coated $SrGa_2S_4$:Eu phosphor was observed under SEM (trade name: XL30-SFEG, manufactured by FEI), it was found that primary particles of ZnO and primary particles of $ZnAl_2O_4$ were adhered in a mixture state on the surface of the $B_2O_3$—$SiO_2$ glass coated $SrGa_2S_4$:Eu phosphor, and they adhered in aggregated state onto the entire surface of the phosphor particles. The surface of the phosphor particles was not exposed. The average particle diameter of the primary particles of ZnO and primary particles of $ZnAl_2O_4$ were not different from the average particle diameter of the starting material.

Examples 18

Synthesis of ZnO compound and $TiO_2$ Compound Coated Sulfur-Containing Phosphor To 100 parts by mass of the phosphor that is described below, 1 part by mass of $TiO_2$ (average particle diameter of 20 nm) was added together with 50 mL of ethanol in a flask with side arm. By using an ultrasonicator, $TiO_2$ particles were dispersed in ethanol. To the mixture, 10 g of the $SrGa_2S_4$:Eu phosphor which had been obtained from Comparative Example 1 was added and the ethanol was evaporated using an evaporator under stirring. As a result, $TiO_2$ adhered $SrGa_2S_4$:Eu phosphor was obtained.

Next, the $B_2O_3$—$SiO_2$ glass coated $TiO_2$ adhered $SrGa_2S_4$:Eu phosphor was obtained in the same manner as Comparative Example 3 except that the aforementioned $TiO_2$ adhered $SrGa_2S_4$:Eu phosphor was used.

Further, the ZnO and $ZnAl_2O_4$ adhered $B_2O_3$—$SiO_2$ glass coated $TiO_2$ adhered $SrGa_2S_4$:Eu phosphor was obtained in the same manner as Example 17 except that the aforementioned $B_2O_3$—$SiO_2$ glass coated $TiO_2$ adhered $SrGa_2S_4$:Eu phosphor was used.

The obtained phosphors were subjected to an ICP analysis by using SPS7800 manufactured by Seiko Instruments Inc. As a result, $N_{Zn}/N_S$ was found to be 0.0549.

Further, when the phosphor was observed under SEM, it was found to be in the same surface state as Example 17.

Example 19

Synthesis of ZnO compound and $TiO_2$ Compound Coated Sulfur-Containing Phosphor To 100 parts by mass of the phosphor that is described below, 1 part by mass of $TiO_2$ (average particle diameter of 20 nm), 4.1 parts of ZnO (average particle diameter of 20 nm), and 2.5 parts of $ZnAl_2O_4$ (average particle diameter of 30 nm) which had been produced in Example 17 were added together with 50 mL of ethanol in a flask with side arm. By using an ultrasonicator, each the particles was dispersed in ethanol. To the mixture, 10 g of the $B_2O_3$—$SiO_2$ glass coated $SrGa_2S_4$:Eu phosphor which had been obtained from Comparative Example 3 was added and the ethanol was evaporated using an evaporator under stirring. As a result, $TiO_2$ and ZnO and $ZnAl_2O_4$ adhered $B_2O_3$—$SiO_2$ glass coated $SrGa_2S_4$:Eu phosphor were obtained.

The obtained phosphor was subjected to an ICP analysis by using SPS7800 manufactured by Seiko Instruments Inc. As a result, $N_{Zn}/N_S$ was found to be 0.0557.

Further, when the obtained phosphor was observed under SEM (trade name: XL30-SFEG, manufactured by FEI), it was found that primary particles of $TiO_2$, primary particles of ZnO, and primary particles of $ZnAl_2O_4$ were aggregated in mixture state on the surface of $B_2O_3$—$SiO_2$ glass coated $SrGa_2S_4$:Eu phosphor, and they adhered in aggregated state onto the entire surface of the phosphor particles. The surface of the phosphor particles was not exposed.

The average particle diameter of the primary particles of $TiO_2$, ZnO and $ZnAl_2O_4$ was not different from the average particle diameter of the starting material.

Example 20

Synthesis of ZnO Adhered $Al_2O_3$ Coated Sulfur-Containing Phosphor Using Fluid CVD Method To a pressure-resistant 100 ml chamber having gas inlet which had a porous plate at the bottom, the $SrGa_2S_4$:Eu phosphor obtained from Comparative Example 1 was added and inside of the chamber was kept under condition including 500° C. and 500 Pa. Next, while controlling the fluid amount to have chamber vacuum level of 300 Pa, trimethyl aluminum gas was introduced via the gas inlet which had a porous plate. Gas was first stopped and kept until the vacuum level reaches 500 Pa. Next, inert gas containing water vapor was introduced via the gas inlet, and after terminating the introduction, it was kept until the vacuum level reached 500 Pa. A single cycle consisted of those processes, and the same cycle was repeated 500 times. Next, triethyl aluminum gas was switched to diethyl zinc gas, and the same cycle was repeated 500 times.

By using the fluid bed CVD method, ZnO coated $Al_2O_3$ coated $SrGa_2S_4$:Eu phosphor was obtained. The obtained phosphor was subjected to an ICP analysis by using SPS7800 manufactured by Seiko Instruments Inc. As a result, $N_{Zn}/N_S$ was found to be 0.0284. Further, when it was observed under SEM (trade name: XL30-SFEG, manufactured by FEI) at each timing including after coating with $Al_2O_3$ and coating with ZnO, it was found that $Al_2O_3$ layer and ZnO layer were evenly formed on the surface of the $SrGa_2S_4$:Eu phosphor, and surface of the phosphor particles was not exposed.

Comparative Example 6

Synthesis of $CaGa_2S_4$:$Eu^{2+}$($Ca_{0.97}Eu_{0.03}Ga_2S_4$) Phosphor

CaS, $Ga_2S_3$, and EuS as a starting material were weighed and mixed to have desired composition, and then further mixed for 100 min by a paint shaker using zirconia ball with $\phi 3$ mm as a medium. The obtained mixture was calcined for 4 hours at 980° C. under atmosphere of hydrogen sulfide. Thereafter, the calcined product was ground for 1 min using an automatic grinding mixer (trade name: ALM-360T, manufactured by NITTO KAGAKU Co., Ltd.), and by using a sieve of 140 mesh and a sieve of 440 mesh, those under the sieve of 140 mesh but above the sieve of 440 mesh were collected to obtain the phosphor powder (sample) consisting of $CaGa_2S_4$:$Eu^2$. The obtained phosphor was subjected to an ICP analysis by using SPS7800 manufactured by Seiko Instruments Inc., and as a result, Zn was not detected.

Comparative Example 7

Synthesis of SrS $Eu^{2+}$($Sr_{0.99}Eu_{0.01}S$) Phosphor

SrS and EuS as a starting material were weighed and mixed to have desired composition, and then further mixed for 100 min by a paint shaker using zirconia ball with $\phi 3$ mm as a medium. The obtained mixture was calcined for 6 hours at 1100° C. under atmosphere of hydrogen sulfide. Thereafter, the calcined product was ground for 1 min using an automatic grinding mixer (trade name: ALM-360T, manufactured by NITTO KAGAKU Co., Ltd.), and by using a sieve of 140 mesh and a sieve of 440 mesh, those under the sieve of 140 mesh but above the sieve of 440 mesh were collected to obtain the phosphor powder (sample) consisting of SrS:$Eu^{2+}$. The obtained phosphor was subjected to an ICP analysis in the same manner as Comparative Example 1, and as a result, Zn was not detected.

Comparative Example 8

Synthesis of $B_2O_3$—$SiO_2$ Glass Coated $CaGa_2S_4$:$Eu^{2+}$ Phosphor

To ethanol in which the $CaGa_2S_4$:$Eu^{2+}$ phosphor obtained from Comparative Example 6 was suspended, pure water, Si(OEt)$_4$, and $H_3BO_3$ were added and a small amount of ammonia water was further added as a catalyst for hydrolysis at 60° C. Accordingly, a glass precursor and phosphor composite in which surface of the phosphor was coated with the glass precursor gel was synthesized.

The resulting composite was heated for 30 min at 600° C. to obtain $B_2O_3$—$SiO_2$ glass coated $CaGa_2S_4$:$Eu^{2+}$ phosphor which had been coated with $B_2O_3$—$SiO_2$ glass. The obtained phosphor was subjected to an ICP analysis in the same manner as Comparative Example 1, and as a result, Zn was not detected. Further, as a result of the ICP analysis, the mass ratio between the phosphor component and the glass component ($SiO_2$ and $B_2O_3$) was found to be 1:0.0448.

Comparative Example 9

Synthesis of $B_2O_3$—$SiO_2$ Glass Coated SrS:$Eu^{2+}$ Phosphor

To ethanol in which the SrS:$Eu^2$ phosphor obtained from Comparative Example 7 was suspended, pure water, Si(OEt)$_4$, and $H_3BO_3$ were added and a small amount of ammonia water was further added as a catalyst for hydrolysis at 60° C. Accordingly, glass precursor and phosphor composite in which surface of the phosphor was coated with the glass precursor gel was synthesized.

The obtained composite was subjected to a heat treatment at 600° C. for 30 min to obtain $B_2O_3$—$SiO_2$ glass coated SrS:$Eu^{2+}$ phosphor which had been coated with $B_2O_3$—$SiO_2$ glass. The resulting phosphor was subjected to an ICP analysis in the same manner as Comparative Example 1, and as a result, Zn was not detected. Further, as a result of the ICP analysis, the mass ratio between the phosphor component and the glass component ($SiO_2$ and $B_2O_3$) was found to be 1:0.0473.

Example 21

Synthesis of ZnO Compound Coated Sulfur-Containing Phosphor

To 100 parts by mass of the phosphor that is described below, 10 parts of ZnO (average particle diameter of 30 nm) was added together with 50 mL of ethanol in a flask with side arm. By using an ultrasonicator, ZnO was dispersed in ethanol. To the mixture, 10 g of the $B_2O_3$—$SiO_2$ glass coated SrGa$_2$S$_4$:$Eu^{2+}$ phosphor which had been obtained from Comparative Example 3 was added and the ethanol was evaporated using an evaporator under stirring. As a result, ZnO adhered $B_2O_3$—$SiO_2$ glass coated SrGa$_2$S$_4$:$Eu^{2+}$ phosphor was obtained.

The obtained phosphor was subjected to an ICP analysis by using SPS7800 manufactured by Seiko Instruments Inc. As a result, $N_{Zn}/N_S$ was found to be 0.109.

Further, when the obtained ZnO adhered $B_2O_3$—$SiO_2$ glass coated SrGa$_2$S$_4$:$Eu^{2+}$ phosphor was observed under SEM (trade name: XL30-SFEG, manufactured by FEI), it was found that primary particles of ZnO were partially adhered in an aggregated state on the surface of the $B_2O_3$—$SiO_2$ glass coated SrGa$_2$S$_4$:$Eu^{2+}$ phosphor particles, and the surface of the phosphor particles was partially exposed. The average particle diameter of the primary particles of ZnO was not different from the average particle diameter of the starting material.

Example 22

Synthesis of ZnO Compound Coated Sulfur-Containing Phosphor

To 100 parts by mass of the phosphor that is described below, 10 parts of ZnO (average particle diameter of 30 nm) was added together with 50 mL of ethanol in a flask with side arm. By using an ultrasonicator, ZnO was dispersed in ethanol. To the mixture, 10 g of the $B_2O_3$—$SiO_2$ glass coated CaGa$_2$S$_4$:$Eu^{2+}$ phosphor which had been obtained from Comparative Example 8 was added and the ethanol was evaporated using an evaporator under stirring. As a result, ZnO adhered $B_2O_3$—$SiO_2$ glass coated CaGa$_2$S$_4$:$Eu^{2+}$ phosphor was obtained.

The obtained phosphor was subjected to an ICP analysis by using SPS7800 manufactured by Seiko Instruments Inc. As a result, $N_{Zn}/N_S$ was found to be 0.095.

Further, when the obtained ZnO adhered $B_2O_3$—$SiO_2$ glass coated CaGa$_2$S$_4$:$Eu^{2+}$ phosphor was observed under SEM (trade name: XL30-SFEG, manufactured by FEI), it was found that primary particles of ZnO were partially adhered in an aggregated state on the surface of the $B_2O_3$—$SiO_2$ glass coated SrGa$_2$S$_4$:$Eu^{2+}$ phosphor particles, and the surface of the phosphor particles was partially exposed. The average particle diameter of the primary particles of ZnO was not different from the average particle diameter of the starting material.

Example 23

Synthesis of ZnO Compound Coated Sulfur-Containing Phosphor

To 100 parts by mass of the phosphor that is described below, 10 parts of ZnO (average particle diameter of 30 nm) was added together with 50 mL of ethanol in a flask with side arm. By using an ultrasonicator, ZnO was dispersed in ethanol. To the mixture, 10 g of the $B_2O_3$—$SiO_2$ glass coated SrS:$Eu^{2+}$ phosphor which had been obtained from Comparative Example 9 was added and the ethanol was evaporated using an evaporator under stirring. As a result, ZnO adhered $B_2O_3$—$SiO_2$ glass coated SrS:$Eu^{2+}$ phosphor was obtained.

The obtained phosphor was subjected to an ICP analysis by using SPS7800 manufactured by Seiko Instruments Inc. As a result, $N_{Zn}/N_S$ was found to be 0.147.

Further, when the obtained ZnO adhered $B_2O_3$—$SiO_2$ glass coated SrS:$Eu^{2+}$ phosphor was observed under SEM (trade name: XL30-SFEG, manufactured by FEI), it was found that primary particles of ZnO were partially adhered in an aggregated state on the surface of the $B_2O_3$—$SiO_2$ glass coated SrS:$Eu^{2+}$ phosphor particles, and the surface of the phosphor particles was partially exposed. The average particle diameter of the primary particles of ZnO was not different from the average particle diameter of the starting material.

Example 23-2

Synthesis of ZnO Compound Coated Sulfur-Containing Phosphor

To 100 parts by mass of the phosphor that is described below, 10 parts of ZnO (average particle diameter of 30 nm) was added together with 50 mL of ethanol in a flask with side arm. By using an ultrasonicator, ZnO was dispersed in ethanol. To the mixture, 10 g of the SrS $Eu^{2+}$ phosphor which had been obtained from Comparative Example 7 was added and stirred using an evaporator. To ethanol in which the ZnO adhered SrS:$Eu^{2+}$ phosphor was suspended, pure water, Si(OEt)$_4$, and $H_3BO_3$ were added and a small amount of ammonia water was further added as a catalyst for hydrolysis at 60° C. Accordingly, a glass precursor and ZnO adhered phosphor composite in which surface of the ZnO adhered phosphor was coated with the glass precursor gel was synthesized.

The resulting composite was heated for 30 min at 600° C. to obtain $B_2O_3$—$SiO_2$ glass coated ZnO adhered SrS:$Eu^{2+}$ phosphor that was coated with $B_2O_3$—$SiO_2$ glass.

The obtained phosphor was subjected to an ICP analysis by using SPS7800 manufactured by Seiko Instruments Inc. As a result, $N_{Zn}/N_S$ was found to be 0.134. Further, when the obtained $B_2O_3$—$SiO_2$ glass coated ZnO adhered SrS:$Eu^{2+}$ phosphor was observed under SEM (trade name: XL30-SFEG, manufactured by FEI), it was found that primary particles of ZnO were partially adhered in an aggregated state on the surface of the $B_2O_3$—$SiO_2$ glass coated SrS:$Eu^{2+}$ phosphor particles, and the surface of the phosphor particles was partially exposed. The average particle diameter of the primary particles of ZnO was not different from the average particle diameter of the starting material.

<Ag Corrosion Test>

Each of the phosphors obtained from Examples and Comparative Examples was kneaded with a silicone resin to obtain a phosphor resin mixture. On Ag film side of a Ag film attached glass plate including Ag film (70 nm) which had been formed by coating on a quartz glass plate, the phosphor resin mixture was coated to thickness of 300 μm followed by curing by heating at 120° C. for 1 hour to obtain a test piece for environment test.

In addition, a test piece in which a resin not blended with any phosphor was coated and cured on an Ag film side of the glass plate was also prepared (Reference Example).

The test pieces of Examples and Comparative Examples in which the phosphor was used were kept in an incubator at 60° C., 90% RH for 20 hours, and the phosphor resin mixture film of the test piece after keeping was peeled using tweezers, and reflection ratio (%) of the exposed Ag film was measured for evaluating corrosion of the Ag film. Results obtained from Examples 1 to 23 and Comparative Examples 1 to 9 are illustrated in Table 1 and Table 2 and also results obtained from Examples 1 to 16 and Comparative Examples 1 to 4 are illustrated in FIGS. 5 to 9.

Meanwhile, measurement of the reflection ratio was performed by using a spectrophotometer for color measurement (trade name: CM-2600d, manufactured by Konica Minolta Holdings, Inc.).

<Test for Determining Hydrogen Sulfide Gas Generation Amount>

Each of the phosphors obtained from Examples 1 to 16 and Comparative Examples 1 to 4 was weighed in an amount of 2 g, and then thinly applied on a Petri dish made of Pyrex (registered trademark) glass. In addition, a Petri dish made of Pyrex (registered trademark) glass to which 10 g of pure water was added was prepared.

To an acrylic rectangular desiccator (internal volume: 6.76 L) which could be sealed, the Petri dishes applied with the phosphors obtained from Comparative Examples and Examples, the Petri dish applied with pure water, a diffusion type hydrogen sulfide detector GHS-8AT (manufactured by GASTEC Corporation, measurement range of between 0 and 125 ppm), and a button type temperature and humidity logger (trade name: HYGROCHRON, manufactured by KH Laboratory) were placed, and then the desiccator was sealed.

In addition, the entire desiccator was placed in an incubator adjusted to 30° C. (ESPEC SH-641), and then the concentration of hydrogen sulfide was measured in the same state for 10 hours.

The temperature and humidity within the acrylic desiccator during measurement of the concentration of hydrogen sulfide were approximately 30° C. and 90% RH, respectively.

The results are illustrated in FIGS. 1 to 4.

<Evaluation of Light Emission Efficiency of Phosphor>

External quantum efficiencies (excitation wavelength: 450 nm) of the phosphors obtained from Examples 1 to 23 and Comparative Examples 1 to 9 were measured by using FP-6500 manufactured by JASCO Corporation.

For each of Comparative Examples and Examples, $N_{Zn}/N_S$ and results from the Ag corrosion test (that is, Ag reflection ratio) and the external quantum efficiency evaluation are illustrated in Table 1 and Table 2.

TABLE 1

| Sample | Phosphor | Glass | ZnO compound | $N_{zn}/N_s$ | Ag reflection ratio (560 nm) | External quantum efficiency |
|---|---|---|---|---|---|---|
| Comparative Example 1 | SrGa$_2$S$_4$:Eu$^{2+}$ | None | None | Zn was not detected | 17.2% | 63.5% |
| Comparative Example 2 | CaS:Eu$^{2+}$ | None | None | Zn was not detected | 20.1% | 72.5% |
| Comparative Example 3 | SrGa$_2$S$_4$:Eu$^{2+}$ | B$_2$O$_3$—SiO$_2$ | None | Zn was not detected | 36.5% | 62.4% |
| Comparative Example 4 | CaS:Eu$^{2+}$ | SiO$_2$ | None | Zn was not detected | 60.9% | 71.7% |
| Example 1 | SrGa$_2$S$_4$:Eu$^{2+}$ | None | ZnO | 0.00506 | 70.4% | 63.4% |
| Example 2 | SrGa$_2$S$_4$:Eu$^{2+}$ | None | ZnO | 0.0102 | 77.7% | 63.2% |
| Example 3 | SrGa$_2$S$_4$:Eu$^{2+}$ | None | ZnO | 0.0210 | 81.9% | 62.9% |
| Example 4 | SrGa$_2$S$_4$:Eu$^{2+}$ | None | ZnO | 0.0536 | 89.2% | 62.7% |
| Example 5 | SrGa$_2$S$_4$:Eu$^{2+}$ | None | ZnO | 0.109 | 93.3% | 61.4% |
| Example 6 | SrGa$_2$S$_4$:Eu$^{2+}$ | None | ZnO | 0.218 | 94.5% | 60.3% |
| Example 7 | SrGa$_2$S$_4$:Eu$^{2+}$ | None | ZnO | 0.329 | 96.2% | 59.1% |
| Example 8 | SrGa$_2$S$_4$:Eu$^{2+}$ | None | ZnO | 0.551 | 97.0% | 57.3% |
| Example 9 | SrGa$_2$S$_4$:Eu$^{2+}$ | None | ZnO | 1.09 | 96.9% | 48.9% |
| Example 10 | CaS:Eu$^{2+}$ | None | ZnO | 0.0171 | 92.9% | 72.1% |
| Example 11 | SrGa$_2$S$_4$:Eu$^{2+}$ | B$_2$O$_3$—SiO$_2$ | ZnO | 0.0225 | 94.6% | 61.8% |

TABLE 1-continued

| | | | | | | |
|---|---|---|---|---|---|---|
| Example 11-2 | SrGa$_2$S$_4$:Eu$^{2+}$ | B$_2$O$_3$—SiO$_2$ | ZnO | 0.0223 | 93.1% | 61.9% |
| Example 12 | CaS:Eu$^{2+}$ | SiO$_2$ | ZnO | 0.0193 | 95.9% | 71.3% |
| Example 13 | SrGa$_2$S$_4$:Eu$^{2+}$ | None | Zinc stearate | — | 80.9% | 60.6% |
| Example 14 | CaS:Eu$^{2+}$ | None | Zinc stearate | — | 86.9% | 69.1% |
| Example 15 | SrGa$_2$S$_4$:Eu$^{2+}$ | B$_2$O$_3$—SiO$_2$ | Zinc stearate | — | 91.2% | 59.6% |
| Example 16 | CaS:Eu$^{2+}$ | SiO$_2$ | Zinc stearate | — | 94.6% | 69.0% |
| Reference Example | None | None | None | — | 97.9% | — |
| Comparative Example 5 | SrGa$_2$S$_4$:Eu$^{2+}$ | None | ZnO | 0.0097 | 53.8% | 63.1% |

| Sample | Phosphor | ZnO compound | Glass | $N_{zn}/N_s$ | Ag reflection ratio (560 nm) | External quantum efficiency |
|---|---|---|---|---|---|---|
| Example 10-2 | CaS:Eu | ZnO | SiO$_2$ | 0.0168 | 73.9% | 64.4% |

TABLE 2

| Sample | Phosphor | Glass layer | Zn compound layer | Other layer | $N_{zn}/N_s$ | Ag reflection ratio (560 nm) | External quantum efficiency |
|---|---|---|---|---|---|---|---|
| Example 17 | SrGa$_2$S$_4$:Eu | B$_2$O$_3$—SiO$_2$ | ZnO + ZnAl$_2$O$_4$ | None | 0.0551 | 98.2% | 61.0% |
| Example 18 | SrGa$_2$S$_4$:Eu | B$_2$O$_3$—SiO$_2$ | ZnO + ZnAl$_2$O$_4$ | TiO$_2$ | 0.0549 | 98.5% | 60.0% |
| Example 19 | SrGa$_2$S$_4$:Eu | B$_2$O$_3$—SiO$_2$ | ZnO + ZnAl$_2$O$_4$ | TiO$_2$ | 0.0557 | 97.5% | 59.7% |
| Example 20 | SrGa$_2$S$_4$:Eu | None | ZnO | Al$_2$O$_3$ | 0.0284 | 98.7% | 60.4% |
| Comparative Example 6 | CaGa$_2$S$_4$:Eu | None | None | None | 0 | 22.5% | 62.2% |
| Comparative Example 7 | SrS:Eu | None | None | None | 0 | 24.3% | 68.3% |
| Comparative Example 8 | CaGa$_2$S$_4$:Eu | B$_2$O$_3$—SiO$_2$ | None | None | 0 | 24.3% | 63.4% |
| Comparative Example 9 | SrS:Eu | B$_2$O$_3$—SiO$_2$ | None | None | 0 | 26.7% | 67.8% |
| Example 21 | SrGa$_2$S$_4$:Eu | B$_2$O$_3$—SiO$_2$ | ZnO | None | 0.109 | 94.6% | 60.8% |
| Example 22 | CaGa$_2$S$_4$:Eu | B$_2$O$_3$—SiO$_2$ | ZnO | None | 0.095 | 93.2% | 61.3% |
| Example 23 | SrS:Eu | B$_2$O$_3$—SiO$_2$ | ZnO | None | 0.147 | 96.3% | 67.9% |

| Sample | Phosphor | Zn compound layer | Glass layer | Other layer | $N_{zn}/N_s$ | Ag reflection ratio (560 nm) | External quantum efficiency |
|---|---|---|---|---|---|---|---|
| Example 23-2 | SrS:Eu | ZnO | B$_2$O$_3$—SiO$_2$ | None | 0.134 | 92.4% | 67.2% |

(Discussions)

From the results of various tests, Examples, and Comparative Examples, it is found that corrosion of an Ag reflection film caused by generated hydrogen sulfide gas can be suppressed by applying a ZnO compound containing Zn and O on the surface of a sulfur-containing phosphor. It seems to be due to the fact that the generated hydrogen sulfide gas is chemically adsorbed onto the ZnO compound present on the surface of a sulfur-containing phosphor.

In such case, as it can be realized from the synthetic method of Examples, the ZnO compound does not necessarily cover entire surface of a sulfur-containing phosphor, and when adhered and scattered over the surface, it can chemically adsorb the generated hydrogen sulfide gas, and therefore a desired effect can be obtained.

Further, considering the chemical property for chemically adsorbing the generated hydrogen sulfide gas by a ZnO compound present on the surface of a sulfur-containing phosphor and having no effect on color, in addition to ZnO, ZnO compounds such as Zn(OH)$_2$, ZnSO$_4$.nH$_2$O (0≤n≤7), ZnTi$_2$O$_4$, Zn$_2$Ti$_3$O$_8$, Zn$_2$TiO$_4$, ZnTiO$_3$, ZnBaO$_2$, ZnBa$_2$O$_3$, ZnGa$_2$O$_4$, Zn$_{1.23}$Ga$_{0.28}$O$_2$, Zn$_3$GaO$_4$, Zn$_6$Ga$_2$O$_9$, Zn$_{0.125-0.95}$Mg$_{0.05-0.9}$O, Zn$_{0.1-0.75}$Ca$_{0.25-0.9}$O, ZnSrO$_2$, Zn$_{0.3}$Al$_{2.4}$O$_4$, ZnAl$_2$O$_4$, Zn$_{3-7}$In$_2$O$_{6-10}$, ZnSnO$_3$, and Zn$_2$SnO$_4$ may obtain the same effect as ZnO.

Further, it is considered that an organic acid salt of zinc such as zinc stearate may also exhibit the same effect.

It was found that, by layering a glass layer containing glass on the surface of a sulfur-containing phosphor in addition to the ZnO compound layer in which ZnO compound was scattered, the water resistance can be further improved.

In this regard, considering the activity of improving water resistance and the activity of adsorbing hydrogen sulfide gas, order for layering the ZnO compound layer and glass layer may be in any order. For example, there can be a configuration in which the ZnO compound layer and the glass layer are layered in order starting from the surface of a sulfur-containing phosphor or a configuration in which the glass layer and the ZnO compound layer are layered in order starting from the surface of a sulfur-containing phosphor.

<Fabrication and Evaluation of Light Emitting Device>

By using the phosphors obtained from the aforementioned Examples and Comparative Examples, a light emitting device (that is, LED package) was fabricated, and then luminous flux retention ratio was evaluated.

Examples 24 to 33 and Comparative Examples 10 to 17

Figure 10:
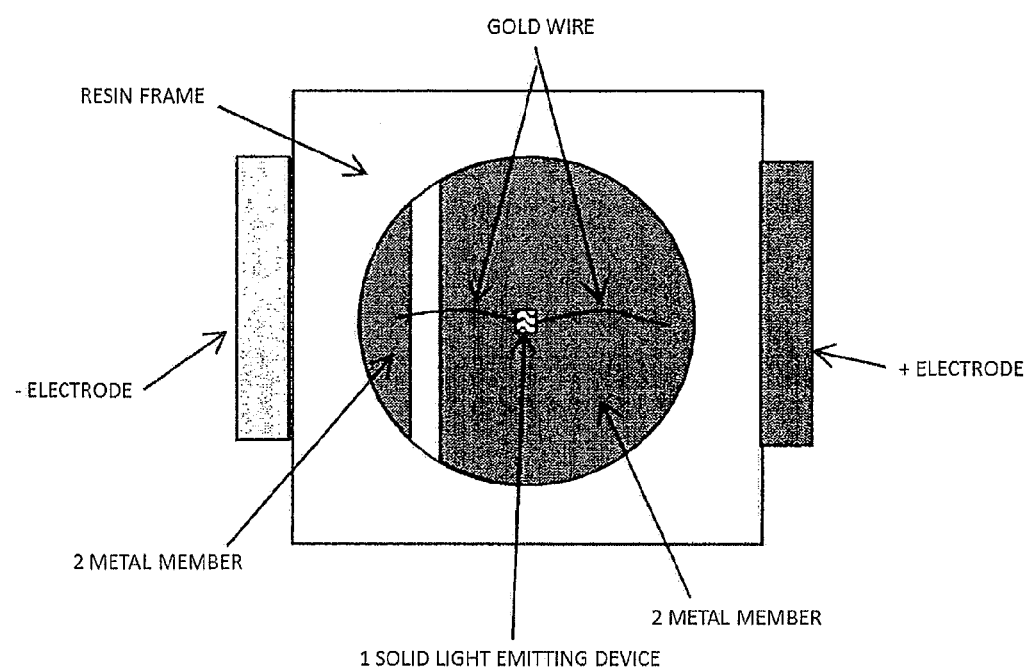
FIG. 10 is a top view for illustrating an LED package (before filling with a phosphor) which had been prepared in Examples 24 to 43 and Comparative Examples 10 to 17.
Figure 11:
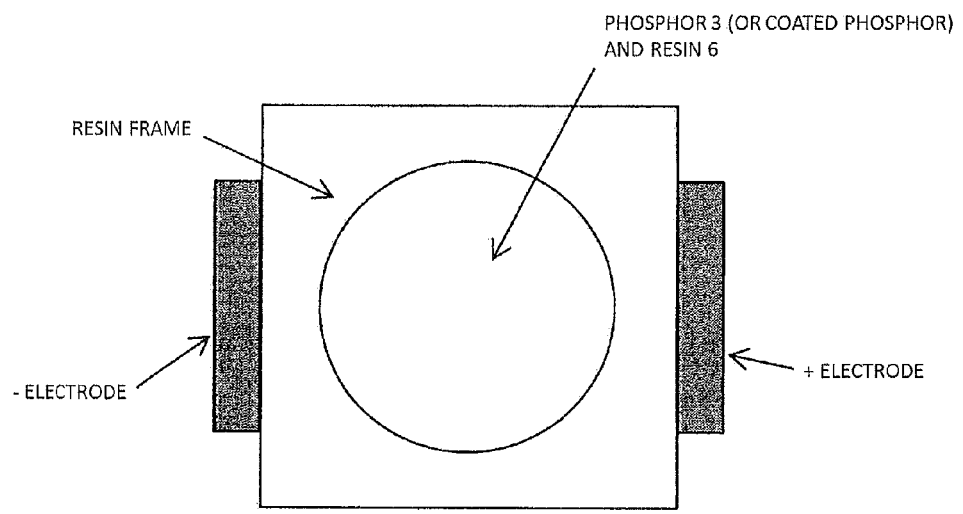
FIG. 11 is a partially enlarged top view of the LED package (after filling with a phosphor) illustrated in FIG. 10.
Figure 12:
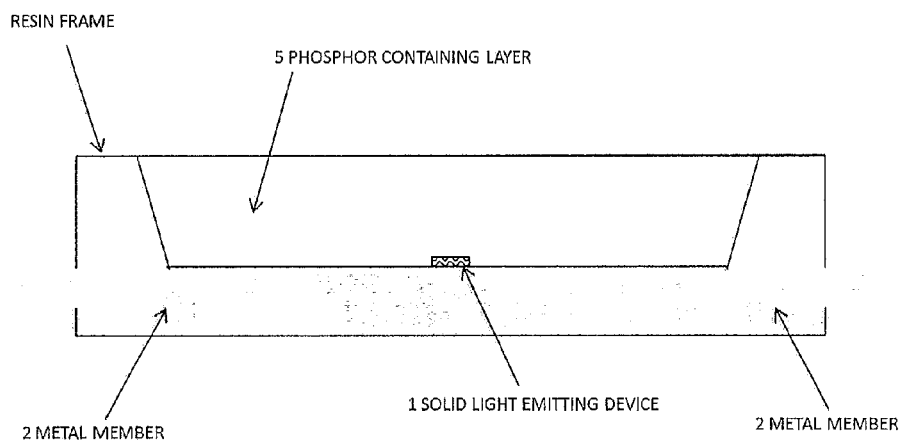
FIG. 12 is vertical cross sectional view of the LED package which had been prepared in Examples 24 to 43 and Comparative Examples 10 to 17.

To the resin (trade name: OE-6630, a silicone resin manufactured by Dow Corning Toray Co., Ltd.) (liquid A:liquid B=1:4), 5% by weight of the each phosphor obtained from each of Examples and Comparative Examples illustrated in Table 3 was added and stirred and deaerated by using a planetary and centrifugal mixer (trade name: AR-250, manufactured by THINKY) for 60 seconds, yielding a mixture of the resin and phosphor. The resulting mixture was filled in a lead frame (see, FIG. 10) to have a thickness of 800 μm. After that, the silicone resin was slowly cured to obtain an LED package (sample) (see, FIGS. 11 and 12).

Examples 34 to 43

To the resin (trade name: OE-6630, a silicone resin manufactured by Dow Corning Toray Co., Ltd.) (liquid A:liquid B=1:4), 5% by weight of the each phosphor obtained from each of Examples illustrated in Table 4 and ZnO (average particle diameter of 30 nm) in an amount corresponding to the "concentration of Zn compound added" illustrated in Table 4 were added and stirred and deaerated by using a planetary and centrifugal mixer (trade name: AR-250, manufactured by THINKY) for 60 seconds, yielding a mixture of the resin and phosphor. The resulting mixture was filled in a lead frame (see, FIG. 10) to have a thickness of 800 μm. After that, the silicone resin was slowly cured to obtain an LED package (sample) (see, FIGS. 11 and 12).

<Method for Evaluating Luminescence Intensity>

In a small environment tester which had been set to have the temperature of 85° C. and the humidity of 85% RH (trade name: SH-641, manufactured by ESPEC Corp.), the samples (that is, LED package) obtained from Examples 24 to 43 and Comparative Examples 10 to 17 were kept for 1000 hours. Then, change in luminous flux after the keeping was determined when the luminous flux before the keeping was 100%.

For measurement of luminous flux, 3 V voltage and 50 mA current were applied to a sample (that is, LED package), light collection was made using a 2-inch integrating sphere ("SPH-2-2" and "BP-2-0" equipped with a baffle, manufactured by Labsphere, Inc.), and light measurement was made using an optical fiber (trade name: VIS-NIR, manufactured by Opto-Sirius Corporation, core diameter of 400 μm) connected to a fiber multi-channel spectrophotometer (trade name: USB4000, manufactured by OptoSirius Corporation). Further, by using software for measurement (trade name: OPwave Version 1.40, manufactured by Ocean Photonics), luminous flux of an LED package was obtained under the condition where integration time is 4 ms, an average number of trials is 10, and the number of smoothing is 10.

In addition, the light emission spectrum and intensity were calibrated by using a halogen source for calibrating absolute intensity (trade name: LS-1-CAL, manufactured by Opto-Sirius Corporation).

Concentration distribution of an adsorbent for sulfur-based gas and concentration of a phosphor were measured by a process including cutting the sample (that is, LED package) near the center and measuring the atomic concentration in the cross-section by using an energy dispersive X ray spectroscopy (EDS). According to the measurement, concentrations of Si, S, Zn, and Sr were analyzed by using an EDS detector (trade name: INCA Energy 250, manufactured by Oxford Instruments) which was connected to a field emission scanning electron microscope (FE-SEM, JSM7001F manufactured by JEOL Ltd.) and a software for quantitative analysis (trade name: INCA Microanalysis Suite, manufactured by Oxford Instruments).

Meanwhile, the acceleration voltage and current for the field emission scanning electron microscope (FE-SEM) were 5 kV and 18 μA, respectively, and the working distance was 10.00 mm. Further, according to point & ID, the quantitative analysis was performed. The set values for the quantitative analysis included the life time of 60 sec, process time of 3, and spectrum range of between 0 and 20 keV.

Peak detection points were as follows: 1.74 keV for Si, 2.31 keV for S, 1.02 keV for Zn, and 1.58 keV for Sr. Further, based on the ZAF calibration, total of the four elements was adjusted to 100% by weight, and then mass concentration was calculated for the each element.

TABLE 3

| Sample | Phosphor supply source | Phosphor | Glass layer | Phosphor concentration compared to resin | Zn compound | Phosphor concentration compared to resin | Luminous flux retention ratio | N'zn/N's |
| --- | --- | --- | --- | --- | --- | --- | --- | --- |
| Comparative Example 10 | Comparative Example 1 | $SrGa_2S_4$:Eu | None | 5 wt. % | None | 0 wt. % | 20% | 0 |
| Comparative Example 11 | Comparative Example 6 | $CaGa_2S_4$:Eu | None | 5 wt. % | None | 0 wt. % | 25% | 0 |
| Comparative Example 12 | Comparative Example 7 | SrS:Eu | None | 5 wt. % | None | 0 wt. % | 15% | 0 |
| Comparative Example 13 | Comparative Example 2 | CaS:Eu | None | 5 wt. % | None | 0 wt. % | 21% | 0 |
| Comparative Example 14 | Comparative Example 3 | $SrGa_2S_4$:Eu | $B_2O_3$—$SiO_2$ | 5 wt. % | None | 0 wt. % | 42% | 0 |
| Comparative Example 15 | Comparative Example 8 | $CaGa_2S_4$:Eu | $B_2O_3$—$SiO_2$ | 5 wt. % | None | 0 wt. % | 43% | 0 |
| Comparative Example 16 | Comparative Example 9 | SrS:Eu | $B_2O_3$—$SiO_2$ | 5 wt. % | None | 0 wt. % | 40% | 0 |
| Comparative Example 17 | Comparative Example 4 | CaS:Eu | $SiO_2$ | 5 wt. % | None | 0 wt. % | 41% | 0 |
| Example 24 | Example 4 | $SrGa_2S_4$:Eu | $B_2O_3$—$SiO_2$ | 5 wt. % | ZnO | 5 wt. % | 93% | 0.55 |
| Example 25 | Example 5 | $SrGa_2S_4$:Eu | None | 5 wt. % | ZnO | 10 wt. % | 95% | 1.17 |
| Example 26 | Example 6 | $SrGa_2S_4$:Eu | None | 5 wt. % | ZnO | 20 wt. % | 96% | 2.21 |
| Example 27 | Example 7 | $SrGa_2S_4$:Eu | None | 5 wt. % | ZnO | 30 wt. % | 92% | 3.37 |

TABLE 3-continued

| Sample | Phosphor supply source | Phosphor | Glass layer | Phosphor concentration compared to resin | Zn compound | Phosphor concentration compared to resin | Luminous flux retention ratio | N'zn/N's |
|---|---|---|---|---|---|---|---|---|
| Example 28 | Example 17 | $SrGa_2S_4$:Eu | $B_2O_3$—$SiO_2$ | 5 wt. % | ZnO + $ZnAl_2O_4$ | 5 wt. % | 97% | 0.26 |
| Example 29 | Example 21 | $SrGa_2S_4$:Eu | $B_2O_3$—$SiO_2$ | 5 wt. % | ZnO | 10 wt. % | 97% | 0.70 |
| Example 30 | Example 22 | $CaGa_2S_4$:Eu | $B_2O_3$—$SiO_2$ | 5 wt. % | ZnO | 10 wt. % | 96% | 1.21 |
| Example 31 | Example 23 | SrS:Eu | $B_2O_3$—$SiO_2$ | 5 wt. % | ZnO | 10 wt. % | 92% | 1.33 |
| Example 32 | Example 16 | CaS:Eu | $SiO_2$ | 5 wt. % | Zinc stearate | 10 wt. % | 95% | 2.22 |
| Example 33 | Example 1 | $SrGa_2S_4$:Eu | None | 5 wt. % | ZnO | 0.5 wt. % | 86% | 0.04 |

TABLE 4

| Sample | Phosphor supply source | Phosphor | Glass layer | Phosphor concentration compared to resin | Zn compound | Concentration of Zn compound | Zn compound | Concentration of added Zn compound | Luminous flux retention ratio | N'zn/N's |
|---|---|---|---|---|---|---|---|---|---|---|
| Example 34 | Example 17 | $SrGa_2S_4$:Eu | $B_2O_3$—$SiO_2$ | 5 wt. % | ZnO + $ZnAl_2O_4$ | 5 wt. % | ZnO + $ZnAl_2O_4$ | 5 wt. % | 97% | 0.43 |
| Example 35 | Example 21 | $SrGa_2S_4$:Eu | $B_2O_3$—$SiO_2$ | 5 wt. % | ZnO | 10 wt. % | ZnO | 10 wt. % | 97% | 0.98 |
| Example 36 | Example 22 | $CaGa_2S_4$:Eu | $B_2O_3$—$SiO_2$ | 5 wt. % | ZnO | 10 wt. % | ZnO | 10 wt. % | 96% | 1.43 |
| Example 37 | Example 23 | SrS:Eu | $B_2O_3$—$SiO_2$ | 5 wt. % | ZnO | 10 wt. % | ZnO | 10 wt. % | 92% | 1.56 |
| Example 38 | Comparative Example 14 | $SrGa_2S_4$:Eu | $B_2O_3$—$SiO_2$ | 5 wt. % | None | 0 wt. % | ZnO | 20 wt. % | 65% | 1.23 |
| Example 39 | Comparative Example 15 | $CaGa_2S_4$:Eu | $B_2O_3$—$SiO_2$ | 5 wt. % | None | 0 wt. % | ZnO | 20 wt. % | 58% | 1.86 |
| Example 40 | Comparative Example 16 | SrS:Eu | $B_2O_3$—$SiO_2$ | 5 wt. % | None | 0 wt. % | ZnO | 20 wt. % | 63% | 2.54 |
| Example 41 | Comparative Example 17 | CaS:Eu | $SiO_2$ | 5 wt. % | None | 0 wt. % | ZnO | 20 wt. % | 76% | 2.86 |
| Example 42 | Example 21 | $SrGa_2S_4$:Eu | $B_2O_3$—$SiO_2$ | 5 wt. % | ZnO | 10 wt. % | ZnO | 40 wt. % | 97% | 5.38 |
| Example 43 | Example 21 | $SrGa_2S_4$:Eu | $B_2O_3$—$SiO_2$ | 5 wt. % | ZnO | 10 wt. % | ZnO | 60 wt. % | Could not be prepared due to high viscosity | |

(Results)

After keeping for 1000 hours the LED packages (that is, samples) which had been obtained from Examples 24 to 33 and Comparative Examples 10 to 17 in a small size environment tester set to have the temperature of 85° C. and the humidity of 85% RH, the results illustrated in Table 3 were obtained.

From Comparative Examples 10 to 17, it was confirmed that the reflecting plate was turned into black color. It seems to be due to the reason that the sulfur-containing gas generated from the sulfur-containing phosphor, in particular, hydrogen sulfide, reacts with the reflection plate (that is, copper alloy coated with silver), and then silver converts into silver sulfide to exhibit black color, for example. When the reflection plate was blackened like that, light emission from the LED package (that is, sample) was deteriorated. Further, when the blackened metal member was an electrode other than reflection plate, disconnection or high resistance may be caused.

On the other hand, no color change of the reflection plate or the like was observed from Examples 24 to 33. It is considered that the sulfur-based gas generated from the sulfur-containing phosphor, in particular, hydrogen sulfide, is adsorbed first onto a ZnO compound as an adsorbent for sulfur-based gas instead of reacting with a metal member (that is, reflection plate) and the ZnO compound present on the surface of the phosphor can suppress the corrosion of the metal member, and thus the light emission can be maintained at the same level as the light emission before the environment test.

Based on the results of the above Examples and the tests, it is considered that the ratio between Zn and S, that is, $N'_{Zn}/N'_S$, that are contained in a package, is preferably between 0 and 20, more preferably between 0.2 and 10, and still more preferably between 0.25 and 6. That is because, when Zn is excessively low, hydrogen sulfide is not sufficiently adsorbed onto the ZnO compound, and on the other hand, when Zn is excessively high, light blocking occurs so that the radiation of light from the LED onto the phosphor cannot be easily obtained.

Further, in view of Examples 34 to 43, it is found that the luminous flux retention ratio can be further improved by adding a Zn compound during package fabrication. Thus, with regard to a phosphor-containing layer, it was also found that a case in which the ZnO compound coated sulfur-containing phosphor and a ZnO compound are scattered in a resin is also preferable.

Based on the above, it is believed that the ZnO compound of a ZnO compound coated sulfur-containing phosphor can still exhibit the effect even when it is released from the phosphor. Thus, even for a case in which part of the ZnO compound present on the surface of the phosphor is released from the phosphor during the process of mixing and stirring the phosphor and resin, it is believed that adsorption onto the ZnO compound as an adsorbent for sulfur-based gas occurs first instead of a reaction between the sulfur-based gas and a metal member (that is, reflection plate).

The invention claimed is:

1. A ZnO compound coated sulfur-containing phosphor particle having: a configuration in which a ZnO compound containing Zn and O and a glass layer containing a glass composition are present on a surface of the sulfur-containing phosphor particle; a host material containing sulfur and one or more selected from a group consisting of calcium, barium, strontium, and gallium; and a luminescent center.

2. A ZnO compound coated sulfur-containing phosphor particle comprising: a ZnO compound layer consisting of a ZnO compound including Zn and O; a glass layer containing a glass composition on a surface of the sulfur-containing phosphor particle; a host material containing sulfur and one or more selected from a group consisting of calcium, barium, strontium, and gallium; and a luminescent center.

3. The ZnO compound coated sulfur-containing phosphor particle according to claim 1, wherein the ZnO compound including Zn and O includes one or more selected from a group consisting of ZnO, $Zn(OH)_2$, $ZnSO_4 \cdot nH_2O$ ($0 \leq n \leq 7$), $ZnTi_2O_4$, $Zn_2Ti_3O_8$, $Zn_2TiO_4$, $ZnTiO_3$, $ZnBaO_2$, $ZnBa_2O_3$, $ZnGa_2O_4$, $Zn_{1.23}Ga_{0.28}O_2$, $Zn_3GaO_4$, $Zn_6Ga_2O_9$, $Zn_{0.125-0.95}Mg_{0.05-0.9}O$, $Zn_{0.1-0.75}Ca_{0.25-0.9}O$, $ZnSrO_2$, $Zn_{0.3}Al_{2.4}O_4$, $ZnAl_2O_4$, $Zn_{3-7}In_2O_{6-10}$, $ZnSnO_3$, $Zn_2SnO_4$, and an organic acid salt of zinc.

4. The ZnO compound coated sulfur-containing phosphor particle according to claim 1, wherein that the ZnO compound including Zn and O is microparticles having an average particle diameter of 0.3 μm or less according to observation by SEM or TEM.

5. The ZnO compound coated sulfur-containing phosphor particle according to claim 1, wherein $N_{Zn}/N_S$, a ratio of $N_{Zn}$ as the number of Zn atoms in the ZnO compound compared to $N_S$ as the number of S atoms in the sulfur-containing phosphor, is 0.001 or higher.

6. The ZnO compound coated sulfur-containing phosphor particle according to claim 1, wherein the microparticles which have a spinel type crystal structure and a particle diameter of less than 0.1 μm are present near the ZnO compound or ZnO compound layer.

7. The ZnO compound coated sulfur-containing phosphor particle according to claim 1, wherein a spinel layer including the microparticles which have the spinel type crystal structure and the particle diameter of less than 0.1 μm are included in contact with the ZnO compound or ZnO compound layer.

8. The ZnO compound coated sulfur-containing phosphor particle according to claim 1, wherein the ZnO compound further includes a water resistant layer comprising one type of hydroxide, oxide, or fluoride selected from a group consisting of Ti, Zn, Mg, Ca, Sr, Ba, Al, Ga, In, Sn, Zr, and Y, or a mixture of two or more of them.

9. A wavelength conversion light emitting device comprising at least one LED chip and at least one phosphor, wherein part of the light emitting from the LED is absorbed by the phosphor to yield mixture light including the light emitting from the LED and light emitting from the phosphor, and wherein at least one phosphor is the ZnO compound coated sulfur-containing phosphor particle according to claim 1.

10. A lighting apparatus comprising the wavelength conversion light emitting device described in claim 9.

11. An image display apparatus comprising the wavelength conversion light emitting device described in claim 9.

12. A light emitting device comprising a solid light emitting device, a metal member reacting with sulfur-based gas, and a phosphor-containing layer, wherein the phosphor-containing layer is formed by blending the ZnO compound coated sulfur-containing phosphor particle according to claim 1 with a resin.

13. A light emitting device comprising a solid light emitting device, a metal member which reacts with sulfur-based gas, and a phosphor-containing layer, wherein the phosphor-containing layer has a configuration in which the ZnO compound coated sulfur-containing phosphor particle according to claim 1 and the ZnO compound are scattered in the resin.

14. The ZnO compound coated sulfur-containing phosphor particle according to claim 1, wherein the glass layer containing a glass composition is formed by heating to a temperature of at least 600° C.

15. The ZnO compound coated sulfur-containing phosphor particle according to claim 2, wherein the glass layer containing a glass composition is formed by heating to a temperature of at least 600° C.

16. The ZnO compound coated sulfur-containing phosphor particle according to claim 1, wherein the ZnO compound is present on and in contact with a surface of the sulfur-containing phosphor.

17. The ZnO compound coated sulfur-containing phosphor particle according to claim 2, wherein the ZnO compound is present on and in contact with a surface of the sulfur-containing phosphor.

18. The ZnO compound coated sulfur-containing phosphor particle according to claim 1, wherein the glass layer containing a glass composition comprises one or more of $SiO_2$, $B_2O_3$—$SiO_2$, and $Ma_2O$—$MbO$—$B_2O_3$—$SiO_2$, wherein Ma represents an alkali metal and Mb represents an alkali earth metal or Zn, wherein the glass composition has undergone glassification.

19. The ZnO compound coated sulfur-containing phosphor particle according to claim 2, wherein the glass layer containing a glass composition comprises one or more of $SiO_2$, $B_2O_3$—$SiO_2$, and $Ma_2O$—$MbO$—$B_2O_3$—$SiO_2$, wherein Ma represents an alkali metal and Mb represents an alkali earth metal or Zn, wherein the glass composition has undergone glassification.

20. A ZnO compound coated sulfur-containing phosphor particle having: a configuration in which a ZnO compound containing Zn and O, a glass layer containing a glass composition, and a water resistant layer are present on a surface of the sulfur-containing phosphor particle; and a host material containing sulfur and one or more selected from a group consisting of calcium, barium, strontium, and gallium; and a luminescent center,
    wherein the water resistant layer comprises one type of hydroxide, oxide, or fluoride selected from a group consisting of Ti, Zn, Mg, Ca, Sr, Ba, Al, Ga, In, Sn, Zr, and Y, or a mixture of two or more of them.

* * * * *